United States Patent
Komatsu et al.

(10) Patent No.: US 9,738,746 B2
(45) Date of Patent: Aug. 22, 2017

(54) COMPOSITION FOR PATTERN FORMATION, PATTERN-FORMING METHOD, AND BLOCK COPOLYMER

(71) Applicant: JSR Corporation, Minato-ku (JP)

(72) Inventors: Hiroyuki Komatsu, Tokyo (JP); Takehiko Naruoka, Tokyo (JP); Tomoki Nagai, Tokyo (JP)

(73) Assignee: JSR Corporation, Minato-ku (JP)

(*) Notice: Subject to any disclaimer, the term of this patent is extended or adjusted under 35 U.S.C. 154(b) by 0 days.

(21) Appl. No.: 15/074,053

(22) Filed: Mar. 18, 2016

(65) Prior Publication Data
US 2016/0293408 A1    Oct. 6, 2016

(30) Foreign Application Priority Data

Mar. 30, 2015   (JP) .................................. 2015-070408

(51) Int. Cl.
*G03F 7/004* (2006.01)
*C08F 293/00* (2006.01)
(Continued)

(52) U.S. Cl.
CPC ............. *C08F 293/00* (2013.01); *C08G 18/61* (2013.01); *C08G 77/38* (2013.01); *C09D 153/00* (2013.01);
(Continued)

(58) Field of Classification Search
CPC ..... G03F 7/002; G03F 7/165; H01L 21/0274; H01L 21/02112; H01L 21/3065;
(Continued)

(56) References Cited

U.S. PATENT DOCUMENTS 9,442,371 B2 *  9/2016  Seshimo .................. G03F 7/11
9,458,353 B1 * 10/2016  Cheng .................. C09D 169/00
(Continued)

FOREIGN PATENT DOCUMENTS

JP    2002-519728    7/2002
JP    2003-218383    7/2003
(Continued)

OTHER PUBLICATIONS

Yuki Kosaka et al. "Living Anionic Polymerization of Benzofulvene: Highly Reactive Fixed Transoid 1,3-Diene", ACS Macro Letters, vol. 2, 2013, 4 pages.

*Primary Examiner* — Amanda C Walke
(74) *Attorney, Agent, or Firm* — Oblon, McClelland, Maier & Neustadt, L.L.P.

(57) ABSTRACT

A pattern-forming method includes forming on one face side of a substrate, a directed self-assembling film, and removing a part of the directed self-assembling film. The directed self-assembling film is formed from a composition including a block copolymer and a solvent. The block copolymer includes a first block composed of a first repeating unit that includes a silicon atom, a second block composed of a second repeating unit that does not include a silicon atom, and a first group that bonds to at least one end of a main chain and links to the first block. The first group is a monovalent group that forms a compound having ClogP of no less than 2.4 provided that a methyl group is bonded to an atom on a side of the main chain. The first group does not comprise a hetero atom.

20 Claims, 5 Drawing Sheets

(51) Int. Cl.

| | | |
|---|---|---|
| *H01L 21/027* | (2006.01) | |
| *H01L 21/02* | (2006.01) | |
| *H01L 21/3065* | (2006.01) | |
| *C09D 183/00* | (2006.01) | |
| *G03F 7/00* | (2006.01) | |
| *G03F 7/16* | (2006.01) | |
| *C08G 77/38* | (2006.01) | |
| *C08G 18/61* | (2006.01) | |
| *H01L 21/308* | (2006.01) | |
| *C09D 153/00* | (2006.01) | |

(52) U.S. Cl.
CPC ........... *C09D 183/00* (2013.01); *G03F 7/002* (2013.01); *G03F 7/165* (2013.01); *H01L 21/0274* (2013.01); *H01L 21/02112* (2013.01); *H01L 21/3065* (2013.01); *H01L 21/3081* (2013.01)

(58) Field of Classification Search
CPC . H01L 21/0392; C09D 153/00; C09D 183/00; C08G 18/61; C08G 77/38
USPC ...... 430/270.1, 272.1, 273.1, 322, 330, 331; 427/261, 258
See application file for complete search history.

(56) References Cited

U.S. PATENT DOCUMENTS

| | | | |
|---|---|---|---|
| 2001/0024684 A1 | 9/2001 | Steiner et al. | |
| 2012/0264884 A1* | 10/2012 | Liu | C08F 297/026 525/276 |
| 2013/0196019 A1* | 8/2013 | Willson | G03F 7/0758 425/470 |
| 2013/0209693 A1 | 8/2013 | Vogel et al. | |
| 2013/0266780 A1* | 10/2013 | Ellison | C08G 63/6952 428/201 |
| 2013/0324666 A1* | 12/2013 | Xia | C08G 83/008 525/182 |
| 2014/0238956 A1* | 8/2014 | Namie | H01L 21/0337 216/83 |
| 2015/0093508 A1* | 4/2015 | Nagai | B82Y 40/00 427/271 |
| 2016/0072148 A1* | 3/2016 | Lee | H01M 10/0565 429/313 |
| 2016/0257789 A1* | 9/2016 | Seshimo | C08G 77/42 |

FOREIGN PATENT DOCUMENTS

| | | |
|---|---|---|
| JP | 2008-149447 | 7/2008 |
| JP | 2013-528664 | 7/2013 |
| JP | 2013-166932 | 8/2013 |
| WO | WO 00/00854 A1 | 1/2000 |
| WO | WO 2011/116223 A1 | 9/2011 |

* cited by examiner

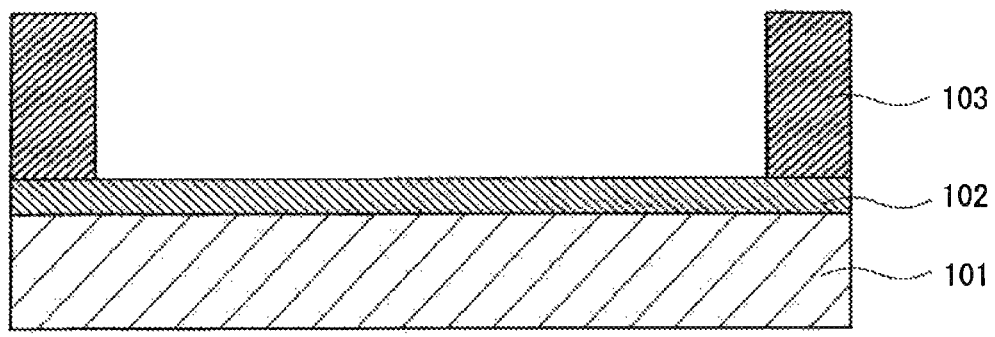
F I G. 2

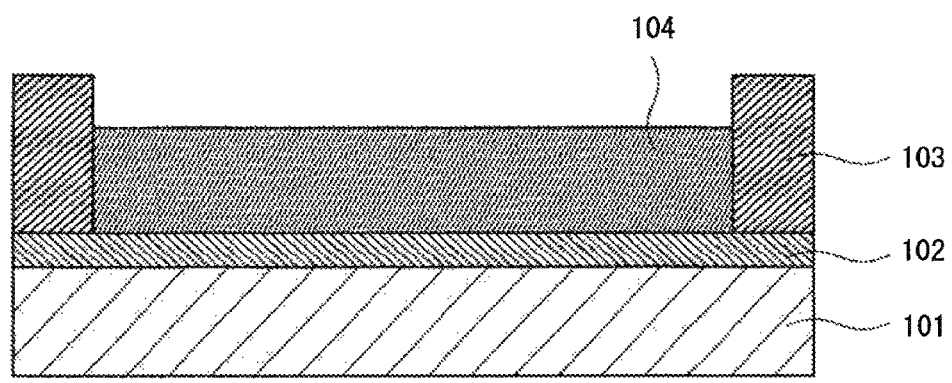
F I G. 3

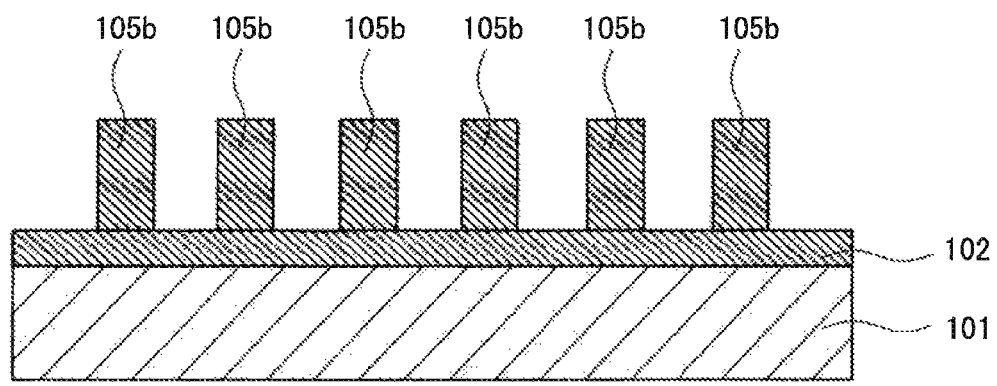
F I G. 5

COMPOSITION FOR PATTERN FORMATION, PATTERN-FORMING METHOD, AND BLOCK COPOLYMER

BACKGROUND OF THE INVENTION

Field of Invention

The present invention relates to a composition for pattern formation, a pattern-forming method and a block copolymer.

Description of the Related Art

Miniaturization of various types of electronic device structures such as semiconductor devices and liquid crystal devices has been accompanied by demands for microfabrication of patterns in pattern-forming steps. In these days, although fine patterns having a line width of about 50 nm can be formed using, for example, an ArF excimer laser, further finer pattern formation has been required.

To meet the demands described above, a directed self-assembly pattern forming method which utilizes a phase separation (microdomain) structure constructed through directed self-assembly, as generally referred to, that spontaneously forms an ordered pattern has been proposed. As such a directed self-assembly pattern forming method, a method for forming an ultrafine pattern by directed self-assembly using a block copolymer that is obtained by copolymerizing a monomer compound having a specific property and a monomer compound having a property that differs from the specific property has been known (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to this method, a pattern can be formed in a self-aligning manner by way of a feature that polymer structures having the same property tend to cluster through annealing of a film containing the block copolymer.

However, the pattern obtained by the conventional method described above is not concluded to be sufficiently fine and therefore, various techniques have been studied in regard to the structure of the block copolymer, and for example, introducing a silicon atom into a part of blocks of the block copolymer has been known (see Japanese Unexamined Patent Application, Publication Nos. 2013-528664 and 2013-166932, and ACS Macro Lett., 1, 1279 (2012)). However, although the composition containing such a conventional block copolymer readily forms a directed self-assembling film having a regular array structure with fine pitches, the composition is disadvantageous in that generation of defects of the regular array structure cannot be sufficiently inhibited.

PRIOR ART DOCUMENTS

Patent Documents

Patent Document 1: Japanese Unexamined Patent Application, Publication No. 2008-149447
Patent Document 2: Japanese Unexamined Patent Application (Translation of PCT Application), Publication No. 2002-519728
Patent Document 3: Japanese Unexamined Patent Application, Publication No. 2003-218383
Patent Document 4: Japanese Unexamined Patent Application, Publication No. 2013-528664
Patent Document 5: Japanese Unexamined Patent Application, Publication No. 2013-166932

Non-Patent Document

Nonpatent Document 1: ACS Macro Lett., 1, 1279 (2012)

SUMMARY OF THE INVENTION

Problems to be Solved by the Invention

The present invention was made in view of the foregoing circumstances, and it is an object of the present invention to provide a composition for pattern formation capable of forming a directed self-assembling film having a regular array structure with fine pitches accompanied by fewer defects, and in turn capable of forming a pattern having a fine and favorable shape, a pattern-forming method and a block copolymer.

Means for Solving the Problems

According to an aspect of the invention made for solving the aforementioned problems, a composition for pattern formation contains a block copolymer that forms a phase separation structure by directed self-assembly (hereinafter, may be also referred to as "(A) block copolymer" or "block copolymer (A)"), and a solvent (hereinafter, may be also referred to as "(B) solvent" or "solvent (B)"), wherein the block copolymer has: a first block (hereinafter, may be also referred to as "block (a)") composed of a first repeating unit (hereinafter, may be also referred to as "repeating unit (I)") that includes a silicon atom; a second block (hereinafter, may be also referred to as "block (b)") composed of a second repeating unit (hereinafter, may be also referred to as "repeating unit (II)") that does not include a silicon atom; and a first group that bonds to at least one end of the main chain and links to the block (a) (hereinafter, may be also referred to as "group (1)"), wherein the group (1) is a monovalent group that forms a compound having ClogP of no less than 2.4 provided that a methyl group is bonded to an atom on a side of the main chain.

According to another aspect of the invention made for solving the aforementioned problems, a pattern-forming method includes the steps of: forming on one face side of a substrate a directed self-assembling film in which phase separation is caused (hereinafter, may be also referred to as "directed self-assembling film-forming step"); and removing a part of the directed self-assembling film (hereinafter, may be also referred to as "removing step"), wherein the directed self-assembling film is formed from the composition for pattern formation.

According to still another aspect of the invention made for solving the aforementioned problems, a block copolymer is provided that forms a phase separation structure by directed self-assembly, wherein the block copolymer has: a first block composed of a first repeating unit that includes a silicon atom; a second block composed of a second repeating unit that does not include a silicon atom; and a first group that bonds to at least one end of the main chain and links to the first block, wherein the first group is a monovalent group that forms a compound having ClogP of no less than 2.4 provided that a methyl group is bonded to an atom on a side of the main chain.

The term "directed self-assembling" or "directed self assembly" as referred to herein means a phenomenon of spontaneously constructing a tissue or a structure without resulting from only the control from an external factor. The "main chain" as referred to means the longest linking chain constituted with carbon atoms derived from carbon atoms constituting a polymerizable carbon-carbon double bond of the monomer in the block copolymer. However, the longest linking chain may include a linking group therein. The "end" in the "at least one end of the main chain" as referred to means a carbon atom not forming a bond with an adjacent repeating unit among the carbon atoms of the main chain included in a repeating unit positioned at a terminal of the block copolymer. "ClogP" may be also referred to as "Clog-Pow" and means a value of octanol/water partition coefficient (log P) determined according to a ClogP method, and a greater ClogP indicates higher hydrophobicity (lipid solubility).

DESCRIPTION OF THE EMBODIMENTS

According to the composition for pattern formation, the pattern-forming method and the block copolymer of the embodiments of the present invention, a directed self-assembling film having a regular array structure with fine pitches accompanied by fewer defects can be formed, and in turn a pattern having a fine and favorable shape can be formed. Therefore, these can be suitably used for pattern forming processes in manufacture of various types of electronic devices such as semiconductor devices and liquid crystal devices for which further microfabrication is demanded.

BRIEF DESCRIPTION OF THE DRAWINGS

FIG. 2 shows a schematic cross sectional view illustrating one example of a state after forming a prepattern on the underlayer film shown in FIG. 1;

FIG. 3 shows a schematic cross sectional view illustrating one example of a state after forming a coating film between facing sides of the prepattern shown in FIG. 2, using a composition for pattern formation;

FIG. 5 shows a schematic cross sectional view illustrating one example of a state after removing a part of a plurality of phases of the directed self-assembling film and the prepattern shown in FIG. 4.

INDUSTRIAL APPLICABILITY

Composition for Pattern Formation

Figure 1:
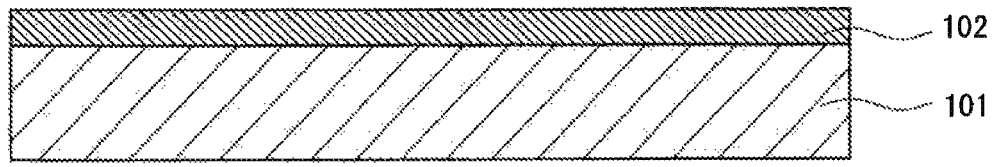
FIG. 1 shows a schematic cross sectional view illustrating one example of a state after forming an underlayer film on a substrate.

The composition for pattern formation according to the embodiment of the present invention contains the block copolymer (A) and the solvent (B). The composition for pattern formation may contain other optional component within a range not leading to impairment of the effects of the present invention. According to the composition for pattern formation, a film having a phase separation structure (directed self-assembling film) is formed on one face side of the substrate by directed self-assembly, and a part of a plurality of phases of the directed self-assembling film is removed, whereby a pattern can be formed. Hereinafter, each component will be described.

(A) Block Copolymer

The block copolymer (A) has the block (a), the block (b) and the group (1), and forms a phase separation structure through directed self-assembly. Each of the blocks is composed of a chain structure of repeating units derived from one type of monomer. The block copolymer (A) having such a plurality of blocks forms phases each configured with the same type of blocks through aggregation of the same type of blocks by heating or the like. In this process, it is presumed that a phase separation structure having an ordered pattern in which different types of phases are periodically and alternately repeated can be formed since the phases formed with different types of the blocks are unlikely to be admixed with each other.

As a result of the block copolymer (A) having: the block (a) composed of the repeating unit (I) that includes a silicon atom; the block (b) composed of the repeating unit (II) that does not include a silicon atom; and the group (1) that bonds to at least one end of the main chain and links to the first block, wherein the group (1) is a monovalent group that forms a compound having ClogP of no less than 2.4 provided that a methyl group is bonded to an atom on a side of the main chain, the composition for pattern formation can form a directed self-assembling film having a regular array structure with fine pitches accompanied by fewer defects. Although not necessarily clarified, the reason for achieving such effects by the composition for pattern formation due to having the constitution as described above may be presumed, for example, as in the following. Specifically, the group (1) forms, with a proviso that a methyl group is bonded to an atom on a side of the main chain, a compound having comparatively high hydrophobicity, i.e., having ClogP of no less than 2.5. Thus, it is considered that due to the features that the repeating unit (I) includes a silicon atom, and that the group (1) having comparatively high hydrophobicity is linked to the block (a), the differences in physical properties such as polarity between the block (a) and the block (b) can be appropriately adjusted, and as a result, a directed self-assembling film can be formed having a regular array structure with fine pitches accompanied by fewer defects.

The block copolymer (A) may have one type or a plurality of types of the block (a), and may have one type or a plurality of types of the block (b).

The block copolymer (A) is exemplified by a diblock copolymer having two blocks, a triblock copolymer having three blocks, a tetrablock copolymer having four blocks and the like. Of these, in light of possible facilitated formation of a desired fine pattern, the diblock copolymer and the triblock copolymer are preferred, and the diblock copolymer is more preferred. The block copolymer (A) may have a linking group between the blocks. Hereinafter, each block, the group (1) and the linking group will be described.

Block (a)

The block (a) is composed of the repeating unit (I) that includes a silicon atom. The lower limit of the number of silicon atom included in the repeating unit (I) is typically 1, preferably 2, and more preferably 3. On the other hand, the upper limit of the number of silicon atom is preferably 20, more preferably 10, still more preferably 7, and even more preferably 5. When the number of silicon atom falls within the above range, the differences in physical properties between the block (a) and the block (b) can be more appropriately adjusted, and as a result, the phase separation structure formed from the block copolymer (A) may be more favorable.

The repeating unit (I) may be either a repeating unit having a silicon atom in the main chain, or a repeating unit having a silicon atom in the side chain, and a repeating unit having a silicon atom in the side chain is preferred. When the repeating unit (I) has the silicon atom in the side chain, the composition for pattern formation can form a directed self-assembling film having a regular array structure with fine pitches accompanied by fewer defects.

The repeating unit (I) is exemplified by a repeating unit represented by the following formula (1) (hereinafter, may be also referred to as "repeating unit (I-1)"), and the like.

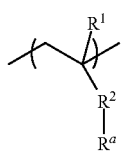

(1)

In the above formula (1), $R^1$ represents a hydrogen atom, a fluorine atom, a methyl group or a trifluoromethyl group; $R^2$ represents a single bond, —O—, —COO— or —CONH—; and $R^a$ represents a monovalent group having 1 to 20 silicon atoms.

In light of the degree of copolymerization of a monomer that gives the repeating unit (I-1), $R^1$ represents preferably a hydrogen atom or a methyl group, and more preferably a methyl group.

The monovalent group having 1 to 20 silicon atoms represented by $R^a$ is exemplified by a group represented by the following formula, and the like.

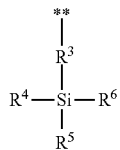

In the above formula, $R^3$ represents a single bond or a divalent hydrocarbon group having 1 to 10 carbon atoms; $R^4$, $R^5$ and $R^6$ each independently represent a hydrogen atom, a monovalent hydrocarbon group having 1 to 10 carbon atoms, —SiR'$_3$, —Si$_2$R'$_5$ or —OSiR'$_3$, or these taken together represent a ring structure having 3 to 10 ring atoms together with the silicon atom to which these bond; R' each independently represents a hydrogen atom or a monovalent hydrocarbon group having 1 to 10 carbon atoms, wherein the sum of the silicon atoms which may be included in $R^4$ to included in $R^6$ is 1 to 20, and ** denotes a binding site to $R^2$ in the above formula (1).

The divalent hydrocarbon group having 1 to 10 carbon atoms which may be represented by $R^3$ is exemplified by a divalent chain hydrocarbon group having 1 to 10 carbon atoms, a divalent alicyclic hydrocarbon group having 3 to 10 carbon atoms, a divalent aromatic hydrocarbon group having 6 to 10 carbon atoms, and the like.

Examples of the divalent chain hydrocarbon group include:

alkanediyl groups such as a methanediyl group, an ethanediyl group, a propanediyl group and a butanediyl group;

alkenediyl groups such as an ethenediyl group and a propenediyl group;

alkynediyl groups such as an ethynediyl group and a propynediyl group; and the like.

Examples of the divalent alicyclic hydrocarbon group include:

cycloalkanediyl groups such as a cyclopentanediyl group and a cyclohexanediyl group;

cycloalkenediyl groups such as a cyclopentenediyl group and a cyclohexenediyl group; and the like.

Examples of the divalent aromatic hydrocarbon group include:

arenediyl groups such as a benzenediyl group, a toluenediyl group and a naphthalenediyl group;

arenediylalkanediyl groups such as a benzenediylmethanediyl group and a benzenediylethanediyl group; and the like.

The monovalent hydrocarbon group having 1 to 10 carbon atoms which may be represented by $R^4$, $R^5$ or $R^6$ is exemplified by a monovalent chain hydrocarbon group having 1 to 10 carbon atoms, a monovalent alicyclic hydrocarbon group having 3 to 10 carbon atoms, a monovalent aromatic hydrocarbon group having 6 to 10 carbon atoms, and the like. Examples of these groups include groups obtained from the groups exemplified as the divalent hydrocarbon group which may be represented by $R^3$ by incorporating one hydrogen atom thereinto, and the like.

Examples of the monovalent hydrocarbon group having 1 to 10 carbon atoms which may be represented by R' include groups similar to the hydrocarbon groups exemplified in connection with $R^4$, $R^5$ and $R^6$, and the like.

The ring structure having 3 to 10 ring atoms which may be taken together represented by $R^4$, $R^5$ and $R^6$ together with the silicon atom to which these bond is exemplified by a ring structure that includes one to five —Si—O—, and the like.

Examples of the repeating unit (I-1) include repeating units represented by the following formulae (1-1) to (1-25) (hereinafter, may be also referred to as "repeating units (I-1-1) to (I-1-25)"), and the like.

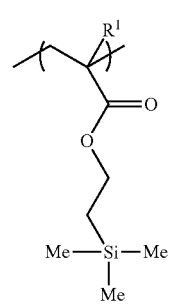

(1-1)

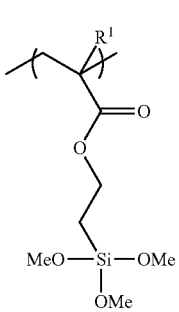

(1-2)

(1-3) 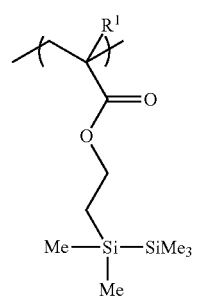
(1-4) 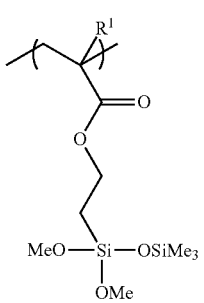
(1-5) 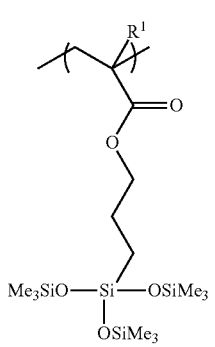
(1-6) 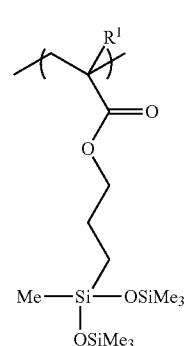
(1-7) 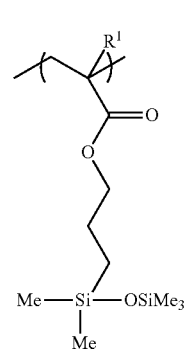
(1-8) 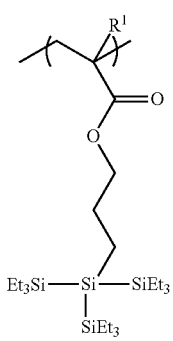
(1-9) 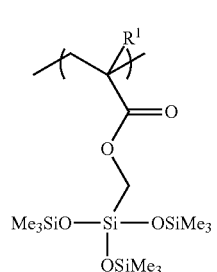
(1-10) 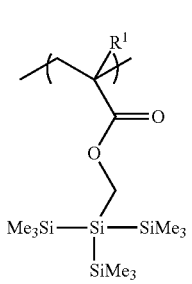
(1-11) 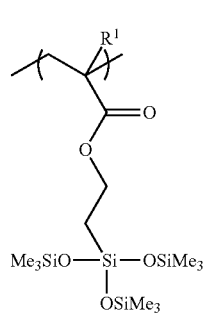
(1-12) 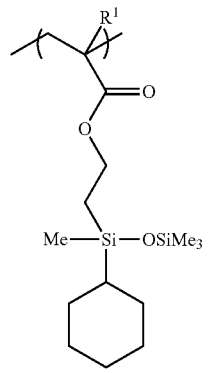

-continued
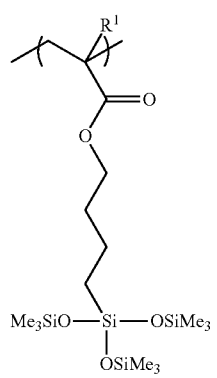
(1-13)
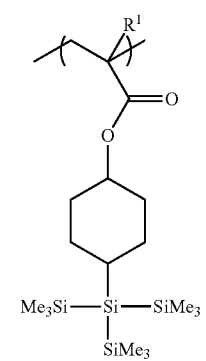
(1-14)
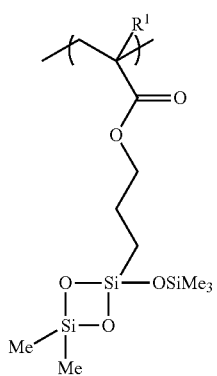
(1-15)
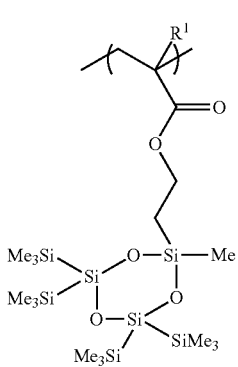
(1-16)
-continued
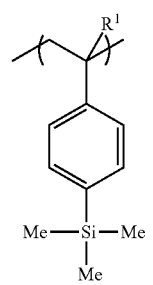
(1-17)
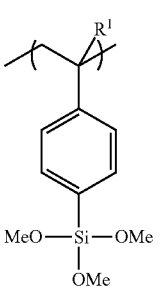
(1-18)
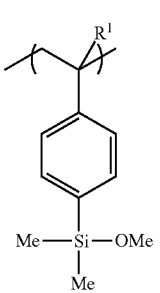
(1-19)
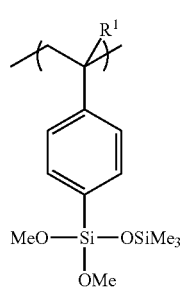
(1-20)
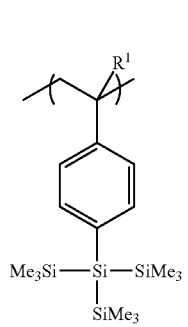
(1-21)

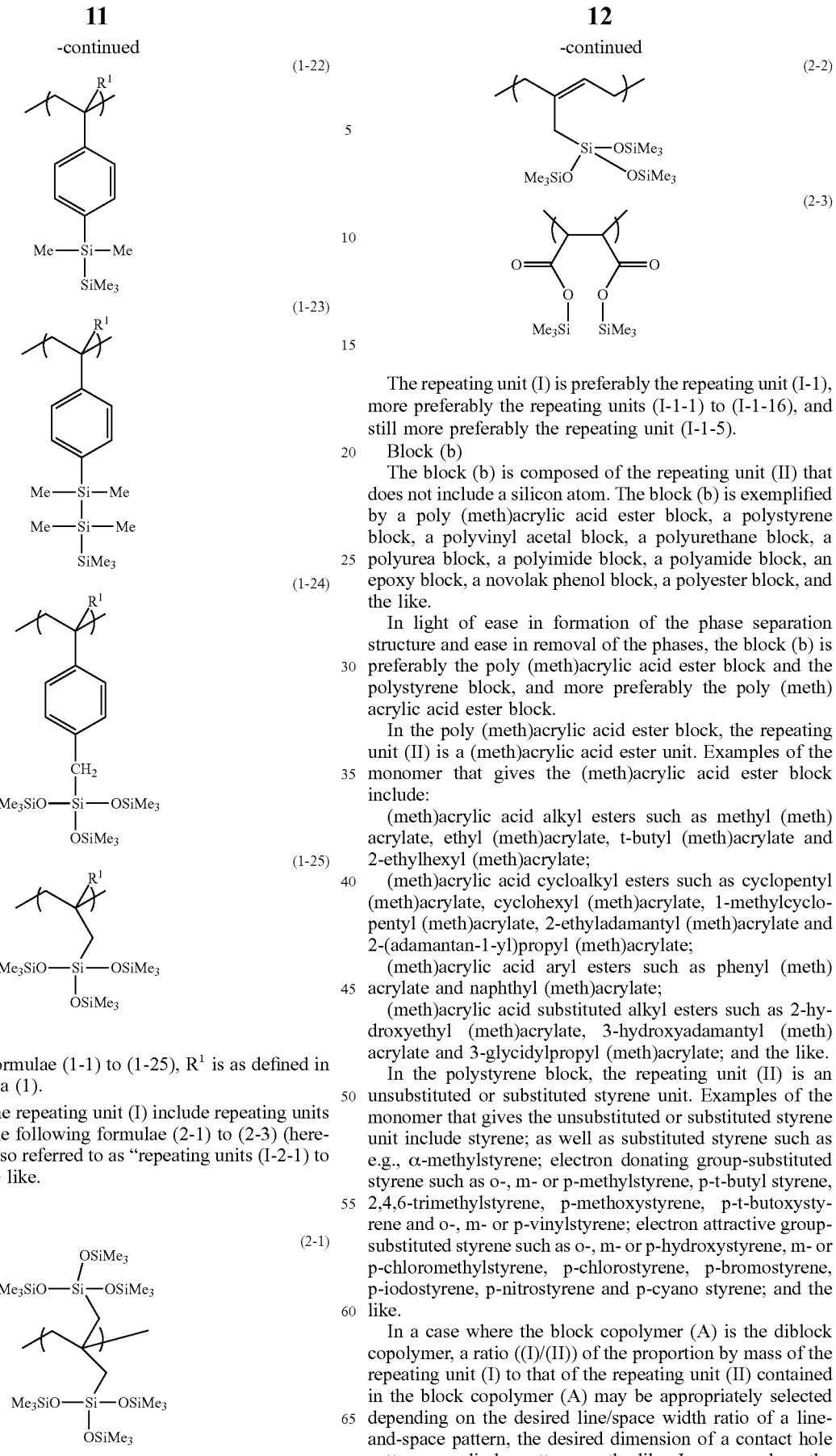

In the above formulae (1-1) to (1-25), R¹ is as defined in the above formula (1).

Examples of the repeating unit (I) include repeating units represented by the following formulae (2-1) to (2-3) (hereinafter, may be also referred to as "repeating units (I-2-1) to (I-2-3)"), and the like.

The repeating unit (I) is preferably the repeating unit (I-1), more preferably the repeating units (I-1-1) to (I-1-16), and still more preferably the repeating unit (I-1-5).

Block (b)

The block (b) is composed of the repeating unit (II) that does not include a silicon atom. The block (b) is exemplified by a poly (meth)acrylic acid ester block, a polystyrene block, a polyvinyl acetal block, a polyurethane block, a polyurea block, a polyimide block, a polyamide block, an epoxy block, a novolak phenol block, a polyester block, and the like.

In light of ease in formation of the phase separation structure and ease in removal of the phases, the block (b) is preferably the poly (meth)acrylic acid ester block and the polystyrene block, and more preferably the poly (meth)acrylic acid ester block.

In the poly (meth)acrylic acid ester block, the repeating unit (II) is a (meth)acrylic acid ester unit. Examples of the monomer that gives the (meth)acrylic acid ester block include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid substituted alkyl esters such as 2-hydroxyethyl (meth)acrylate, 3-hydroxyadamantyl (meth)acrylate and 3-glycidylpropyl (meth)acrylate; and the like.

In the polystyrene block, the repeating unit (II) is an unsubstituted or substituted styrene unit. Examples of the monomer that gives the unsubstituted or substituted styrene unit include styrene; as well as substituted styrene such as e.g., α-methylstyrene; electron donating group-substituted styrene such as o-, m- or p-methylstyrene, p-t-butyl styrene, 2,4,6-trimethylstyrene, p-methoxystyrene, p-t-butoxystyrene and o-, m- or p-vinylstyrene; electron attractive group-substituted styrene such as o-, m- or p-hydroxystyrene, m- or p-chloromethylstyrene, p-chlorostyrene, p-bromostyrene, p-iodostyrene, p-nitrostyrene and p-cyano styrene; and the like.

In a case where the block copolymer (A) is the diblock copolymer, a ratio ((I)/(II)) of the proportion by mass of the repeating unit (I) to that of the repeating unit (II) contained in the block copolymer (A) may be appropriately selected depending on the desired line/space width ratio of a line-and-space pattern, the desired dimension of a contact hole pattern or cylinder pattern, or the like. In a case where the line-and-space pattern is formed, the lower limit of the mass ratio is preferably 20/80, and more preferably 35/65 in light of possible formation of a more favorable phase separation structure, whereas the upper limit of the mass ratio is preferably 80/20, and more preferably 65/35. In a case where the contact hole pattern or the cylinder pattern is formed, the lower limit of the mass ratio is preferably 10/90, and more preferably 20/80, whereas the upper limit of the mass ratio is preferably 90/10, and more preferably 80/20.

Group (1)

The group (1) is bonded to at least one end of the main chain of the block copolymer (A), and links to the block (a). The group (1) may be bonded to both ends of the main chain, and in this case, the two groups (1) may be either the same or different.

The group (1) is preferably introduced with a chain-end terminator described later, or with a polymerization initiator, and more preferably introduced with the chain-end terminator.

The group (1) is a monovalent group that forms a compound having ClogP of no less than 2.4 provided that a methyl group is bonded to an atom on a side of the main chain. The lower limit of ClogP is preferably 2.8, more preferably 3.4, still more preferably 4.0, particularly preferably 4.8, and more particularly preferably 5.5. On the other hand, the upper limit of ClogP is not particularly limited, and is, for example, 7 and preferably 6.5. When ClogP falls within the above range, the composition for pattern formation can form the directed self-assembling film having a regular array structure with fine pitches accompanied by fewer defects. ClogP of the group (1) may be determined by various types of molecular modeling software and the like, and the molecular modeling software is exemplified by "Chemdraw Ver. 12" available from CambridgeSoft Corporation, and the like.

It is to be noted that ClogP of the compound formed, provided that the methyl group is bonded, is a parameter indirectly indicating hydrophilicity of the group (1). In this regard, the methyl group is comparatively small, simple and is not polar. Thus, irrespective of the structure of the group (1), the methyl group has a relatively small influence on ClogP, and the influence may be substantially constant. Therefore, ClogP is a parameter that increases/decreased in accordance predominantly with the hydrophobicity of the group (1), and highly accurately reflect a hydrophobic feature of the group (1).

The lower limit of the number of carbon atoms of the group (1) is preferably 3, more preferably 6, and still more preferably 8. On the other hand, the upper limit of the number of carbon atoms of the group (1) is, for example, 25, and preferably 20.

The group (1) may or may not include a hetero atom. In a case where the group (1) includes a hetero atom, the upper limit of the number of hetero atom included in the group (1) is preferably 1. When the number of hetero atom included in the group (1) is no greater than the upper limit, ClogP can be easily adjusted to fall within the above range. The "hetero atom" as referred to herein means an atom other than the carbon atom and the hydrogen atom.

Examples of the hetero atom include halogen atoms such as a fluorine atom, a chlorine atom and a bromine atom, an oxygen atom, a nitrogen atom, a sulfur atom, a phosphorus atom, a silicon atom and the like. Of these, the oxygen atom, the nitrogen atom and the sulfur atom are preferred, and the nitrogen atom and the sulfur atom are more preferred.

The group (1) is exemplified by a monovalent hydrocarbon group having 3 to 25 carbon atoms, a monovalent aromatic heterocyclic group having 3 to 25 carbon atoms and one hetero atom that constitutes the ring, and the like. The "hydrocarbon group" as referred to involves a chain hydrocarbon group, an alicyclic hydrocarbon group and an aromatic hydrocarbon group. The "hydrocarbon group" may be either a saturated hydrocarbon group or an unsaturated hydrocarbon group. The "chain hydrocarbon group" as referred to means a hydrocarbon group not having a ring structure but being constituted only with a chain structure, which may include a linear hydrocarbon group and a branched hydrocarbon group. The "alicyclic hydrocarbon group" as referred to means a hydrocarbon group having only an alicyclic structure as a ring structure without having an aromatic ring structure, and may include both a monocyclic alicyclic hydrocarbon group and a polycyclic alicyclic hydrocarbon group. However, it is not necessary that the alicyclic hydrocarbon group is constituted with only the alicyclic structure, and a part thereof may have a chain structure. The "aromatic hydrocarbon group" as referred to means a hydrocarbon group having an aromatic ring structure as the ring structure. However, it is not necessary that the aromatic hydrocarbon group is constituted with only the aromatic ring structure, and a part thereof may have a chain structure and/or an alicyclic structure. The "aromatic heterocyclic group" as referred to means a group that has a hetero atom as an atom constituting the ring, and includes a hetero ring having aromaticity. However, it is not necessary that the aromatic hydrocarbon group is constituted with only the aromatic ring structure, and a part thereof may have a chain structure and/or an alicyclic structure.

The monovalent hydrocarbon group is exemplified by a monovalent chain hydrocarbon group having 3 to 25 carbon atoms, a monovalent alicyclic hydrocarbon group having 3 to 25 carbon atoms, a monovalent aromatic hydrocarbon group having 6 to 25 carbon atoms, and the like.

Examples of the monovalent chain hydrocarbon group include:

alkyl groups such as a butyl group, a hexyl group, an octyl group, a decyl group and a dodecyl group;

alkenyl groups such as a hexenyl group, an octenyl group and a decenyl group;

alkynyl groups such as a hexynyl group and an octynyl group; and the like.

In a case where the group (1) is the monovalent chain hydrocarbon group, the lower limit of the number of carbon atoms of the monovalent chain hydrocarbon group is preferably 5, more preferably 7, and still more preferably 9. On the other hand, the upper limit of the number of carbon atoms is preferably 20, more preferably 15, and still more preferably 12.

Examples of the monovalent alicyclic hydrocarbon group include:

monocyclic cycloalkyl groups such as a cyclobutyl group, a cyclopentyl group, a cyclohexyl group and a cyclooctyl group;

monocyclic cycloalkenyl groups such as a cyclobutenyl group, a cyclopentenyl group and a cyclohexenyl group;

polycyclic cycloalkyl groups such as a norbornyl group, an adamantyl group, a tricyclodecyl group and a tetracyclododecyl group;

polycyclic cycloalkenyl groups such as a norbornenyl group, a tricyclodecenyl group and a tetracyclododecenyl group.

In a case where the group (1) is the monovalent alicyclic hydrocarbon group, the lower limit of the number of carbon atoms of the monovalent alicyclic hydrocarbon group is preferably 5, more preferably 7, and still more preferably 9.

On the other hand, the upper limit of the number of carbon atoms is preferably 20, more preferably 15, and still more preferably 12.

Examples of the monovalent aromatic hydrocarbon group include:

aryl groups such as a phenyl group, a tolyl group, a xylyl group, a naphthyl group, an anthryl group and trityl;

aralkyl groups such as a benzyl group, a phenethyl group, a phenylpropyl group and a naphthylmethyl group; and the like.

In a case where the group (1) is the monovalent aromatic hydrocarbon group, the lower limit of the number of carbon atoms of the monovalent aromatic hydrocarbon group is preferably 6, and more preferably 7. On the other hand, the upper limit of the number of carbon atoms is preferably 20.

Examples of the monovalent aromatic heterocyclic group include a thienyl group, an imidazole group, a furyl group, a pyrrolyl group, a carbazolylmethyl group and the like, and of these, the thienyl group and the carbazolylmethyl group are preferred.

In a case where the group (1) is the monovalent aromatic heterocyclic group, the lower limit of the number of carbon atoms of the monovalent aromatic heterocyclic group is preferably 3, and more preferably 4. On the other hand, the upper limit of the number of carbon atoms is preferably 20, and more preferably 15.

Examples of the group (1) include groups represented by the following formulae, and the like.

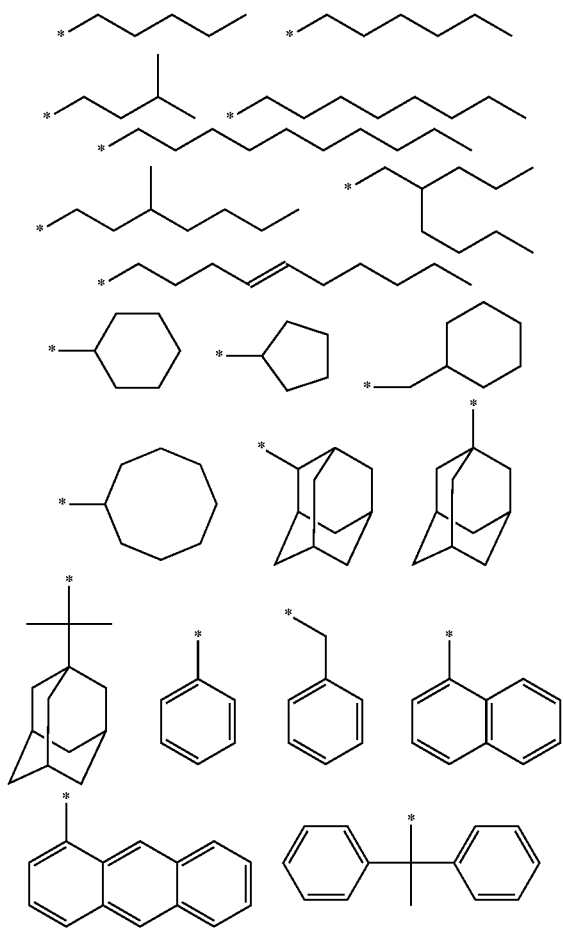

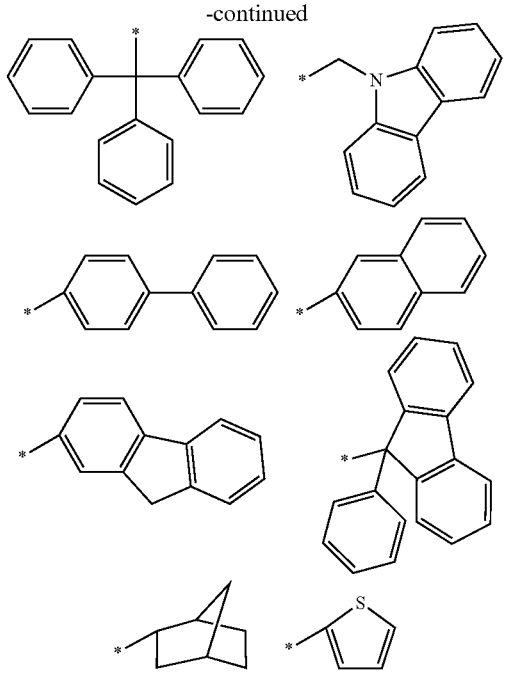

In the above formulae, * denotes a binding site to the end of the main chain of the block copolymer (A).

The group (1) is preferably the monovalent hydrocarbon group having 3 to 25 carbon atoms, and the monovalent aromatic heterocyclic group having 3 to 25 carbon atoms and one hetero atom that constitutes the ring, and more preferably the alkyl group, the cycloalkyl group, the aryl group, the aralkyl group, the carbazolylmethyl group and the thienyl group.

Linking Group

The block copolymer (A) may have a linking group between adjacent block (a) and block (b). When the composition for pattern formation has the linking group in the block copolymer (A), defects of the regular array structure of the directed self-assembling film formed may be further inhibited. The linking group is exemplified by a divalent organic group having 1 to 50 carbon atoms, and the like.

The monomer that gives the linking group is exemplified by diphenylethylene and the like. Diphenylethylene can stabilize the anion end produced during the synthesis of anionic polymerization to yield the block copolymer (A). Accordingly, the dispersity index of the resulting block copolymer (A) can be smaller, and as a result, variance of the dimension of the pattern formed can be lessened. The block copolymer (A) may have one, or two or more types of the linking group.

The lower limit of the weight average molecular weight (Mw) of the block copolymer (A) as determined by gel permeation chromatography (GPC) is preferably 5,000, more preferably 10,000, and still more preferably 15,000. On the other hand, the upper limit of the Mw of the block copolymer (A) is preferably 80,000, more preferably 30,000, still more preferably 22,000, and particularly preferably 19,000. When the Mw of the block copolymer (A) falls within the above range, a more favorable phase separation structure can be formed.

The lower limit of the number average molecular weight (Mn) of the block copolymer (A) as determined by GPC is preferably 4,500, more preferably 9,500, and still more preferably 14,500. On the other hand, the upper limit of the Mn of the block copolymer (A) is preferably 75,000, more preferably 28,000, still more preferably 20,000, and particularly preferably 18,000. When the Mn of the block copolymer (A) falls within the above range, a more favorable phase separation structure can be formed.

The lower limit of the dispersity index (Mw/Mn) of the block copolymer (A) is typically 1. On the other hand, the upper limit of Mw/Mn of the block copolymer (A) is typically 4, preferably 2, more preferably 1.5, still more preferably 1.2, and particularly preferably 1.05. When Mw/Mn of the block copolymer (A) falls within the above range, a more favorable phase separation structure can be formed.

As referred to herein, the Mw and the Mn of the block copolymer (A) are values determined using GPC under the following conditions.

GPC columns: "G2000 HXL"×2, "G3000 HXL"×1, and "G4000 HXL"×1, available from Tosoh Corporation;

elution solvent: tetrahydrofuran (available from Wako Pure Chemical Industries, Ltd.);

flow rate: 1.0 mL/min;
sample concentration: 1.0% by mass;
amount of injected sample: 100 μL;
column temperature: 40° C.;
detector: differential refractometer; and
standard substance: mono-dispersed polystyrene.

The lower limit of the content of the block copolymer (A) with respect to the total solid content in the composition for pattern formation is preferably 80% by mass, more preferably 90% by mass, still more preferably 95% by mass, and particularly preferably 99% by mass.

The lower limit of the concentration of the block copolymer (A) in the composition for pattern formation is preferably 0.3% by mass, more preferably 0.7% by mass, still more preferably 1.0% by mass, and particularly preferably 1.3% by mass. On the other hand, the upper limit of the concentration of the block copolymer (A) in the composition for pattern formation is preferably 5% by mass, more preferably 3% by mass, still more preferably 2% by mass, and particularly preferably 1.7% by mass.

Synthesis Method of Block Copolymer (A)

As the method of synthesizing the block copolymer (A), for example: a first method which includes forming each block in a desired order and thereafter introducing the group (1) by treating the polymerization end with a chain-end terminator; a second method which includes initiating the polymerization with a polymerization initiator that forms the group (1) and then forming each block in a desired order; and the like may be exemplified, and the first method is preferred. Each block of the block copolymer (A) may be synthesized by, for example, living cationic polymerization, living anionic polymerization, living radical polymerization, coordination polymerization (using a Ziegler-Natta catalyst or a metallocene catalyst), or the like. Of these, living anionic polymerization is preferred since the group (1) can be easily introduced.

For example, in a case where the block copolymer (A) is the diblock copolymer having the block (a) and the block (b), according to the method of synthesizing each block by living anionic polymerization, an anionic polymerization initiator is first used to form the block (a) by polymerizing the monomer that gives the block (a) in an appropriate solvent, and thereafter the monomer that gives the block (b) is similarly added thereto, thereby forming the block (b) through linking to the block (a). The linking group may be formed between the block (a) and the block (b) through a reaction with diphenylethylene or the like.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, 2-butanone, 4-methyl-2-pentanone, 2-heptanone and cyclohexanone;

ethers such as tetrahydrofuran, dimethoxyethanes and diethoxyethanes;

alcohols such as methanol, ethanol, 1-propanol, 2-propanol, 4-methyl-2-pentanol; and the like. These solvents may be used either alone of one type, or in combination of two or more types thereof.

The reaction temperature in the polymerization may be predetermined ad libitum in accordance with the type of the polymerization initiator described later, and the lower limit of the reaction temperature is typically −150° C., and preferably −80° C. On the other hand, the upper limit of the reaction temperature is typically 50° C., and preferably 40° C. The lower limit of the reaction time period in the polymerization is typically 5 min, and preferably 20 min. On the other hand, the upper limit of the reaction time period in the polymerization is typically 24 hrs, and preferably 12 hrs.

Examples of the polymerization initiator for use in the polymerization include alkyl lithium, alkylmagnesium halide, naphthalene sodium, alkylated lanthanoid compounds; potassium alkoxide such as t-butoxy potassium and 18-crown-6-ether potassium; alkylzinc such as dimethyl zinc and diethyl zinc; alkyl aluminum such as trimethyl aluminum; aromatic metal compounds such as benzyl potassium, cumyl potassium and cumyl cesium; and the like.

In a case where the group (1) is formed using the polymerization initiator, the lower limit of ClogP of the polymerization initiator is preferably 2.5, more preferably 3.1, and still more preferably 3.2. On the other hand, the upper limit of ClogP of the polymerization initiator is preferably 5, more preferably 3.7, and still more preferably 3.6. When ClogP of the polymerization initiator thus falls within the above range, the group (1) having comparatively high hydrophobicity may be easily introduced into the block copolymer (A). It is to be noted that ClogP of the polymerization initiators represented by the following formulae (i-1) to (i-5) (hereinafter, may be also referred to as "polymerization initiators (i-1) to (i-5)") is each 3.17 for the polymerization initiator (i-1), 3.57 for the polymerization initiator (i-2), 0.368 for the polymerization initiator (i-3), 3.21 for the polymerization initiator (i-4), and 3.37 for the polymerization initiator (i-5).

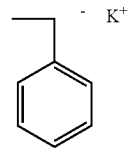

(i-1)

(i-2)
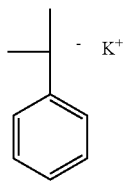

(i-3)
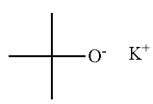

(i-4)
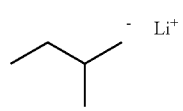

(i-5)
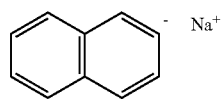

In a case where the monomer to be polymerized is styrene or methyl methacrylate, the polymerization initiator for use in the polymerization is preferably an alkyl lithium compound. Furthermore, in a case where the group (1) is formed using the polymerization initiator, the polymerization initiator for use in the polymerization is preferably polymerization initiators (i-1), (i-2), (i-4) and (i-5).

The chain-end terminator for use in introducing the group (1) is exemplified by a halogenated compound in which the group (1) and a halogen atom are bonded, and the like. Examples of the halogen atom include a chlorine atom, a fluorine atom, a bromine atom and the like, and of these, the bromine atom is preferred.

The lower limit of ClogP of the chain-end terminator is preferably 2.3, more preferably 2.6, still more preferably 3.3, particularly preferably 4.0, and more particularly preferably 5.5. On the other hand, the upper limit of ClogP of the chain-end terminator is preferably 7.0, more preferably 6.1, and still more preferably 5.9. When ClogP of the chain-end terminator falls within the above range, the group (1) having comparatively high hydrophobicity may be easily introduced into the block copolymer (A).

As a specific procedure of treating the polymerization end with the halogenated compound, for example, a method represented by the following scheme may be involved. More specifically, the halogenated compound or the like as the chain-end terminator is added to the block copolymer obtained by living anionic polymerization or the like described above such that the end thereof is modified, whereby the block copolymer (A) having the group (1) introduced at the end of the main chain, and the block (a) and the group (1) are linked can be obtained. It is to be noted that in the following scheme, the block (a) is a poly (meth)acrylic acid ester block.

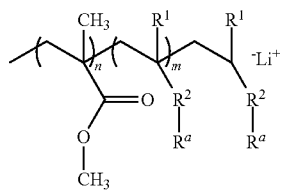

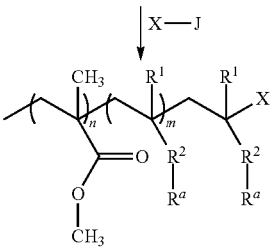

In the above scheme, $R^1$, $R^2$ and $R^a$ are as defined in the above formula (1); n is an integer of no less than 2; m is an integer of no less than 1; J represents a halogen atom; and X represents the group (1).

The block copolymer (A) is preferably recovered by a reprecipitation technique. More specifically, after the reaction was completed, the reaction mixture is charged into a reprecipitation solvent, whereby the intended copolymer is recovered in the form of the powder. As the reprecipitation solvent, alcohols, ultra pure water, alkanes and the like may be used either alone of one type, or in combination of two or more types thereof. Not only the reprecipitation technique, a liquid separation operation as well as a column operation, an ultrafiltration operation or the like may be employed to recover the polymer through removing low-molecular weight component such as monomers and oligomers.

(B) Solvent

The composition for pattern formation contains the solvent (B). The solvent (B) is not particularly limited as long as it can dissolve or disperse therein at least the block copolymer (A).

The solvent (B) is exemplified by an alcohol solvent, an ether solvent, a ketone solvent, an amide solvent, an ester solvent, a hydrocarbon solvent and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethyl cyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partially etherated solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono- 2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvents include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvents include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

ester acetate solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partially etherated acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and valerolactone;

carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ester solvents and the ketone solvents are preferred, the ester solvents are more preferred, the polyhydric alcohol partially etherated acetate solvents are still more preferred, and propylene glycol monomethyl ether acetate is particularly preferred. The composition for pattern formation may contain one, or two or more types of the solvent (B).

Optional Component

The optional component which may be contained in the composition for pattern formation is exemplified by a surfactant and the like. When the composition for pattern formation contains the surfactant, coating properties onto the substrate, etc., can be more improved.

Pattern-Forming Method

The pattern-forming method of the another embodiment of the present invention includes the steps of: forming a directed self-assembling film in which phase separation is caused from the composition for pattern formation (directed self-assembling film having a phase separation structure); and removing a part of the directed self-assembling film. The pattern-forming method may further include before the directed self-assembling film-forming step, the step of forming an underlayer film on one face side of the substrate (hereinafter, may be also referred to as "underlayer film-forming step") and/or forming a prepattern on the one face side of the substrate (hereinafter, may be also referred to as "prepattern-forming step"). According to the pattern-forming method, since the composition for pattern formation is used for forming the directed self-assembling film, the directed self-assembling film having a regular array structure with fine pitches accompanied by fewer defects can be formed, and in turn a pattern having a fine and favorable shape can be formed. Each step will be described below with reference to drawings.

Underlayer Film-Forming Step

According to this step, an underlayer film is formed on the one face side of the substrate. Thus, as shown in FIG. 1, a substrate having an underlayer film can be obtained which includes an underlayer film 102 formed on the one face (upper face) side of a substrate 101. As described later, the directed self-assembling film in the directed self-assembling film-forming step is formed on the side of the underlayer film 102 not facing the substrate (i.e., the upper face side of the underlayer film 102). The phase separation structure (microdomain structure) included in the directed self-assembling film is altered by not only an interaction between each of the blocks of the block copolymer (A) contained in the composition for pattern formation, but also by an interaction with the underlayer film 102; therefore, the structure may be easily controlled by virtue of having the underlayer film 102. Furthermore, when the directed self-assembling film is thin, a transfer process thereof can be improved through forming on the underlayer film 102.

As the substrate 101, for example, a conventionally well-known substrate, e.g., a silicon wafer, a wafer coated with aluminum, or the like may be used.

As the composition for underlayer film formation for use in forming the underlayer film 102, a conventionally well-known organic material for forming an underlayer film or the like may be used, which is exemplified by a composition for underlayer film formation containing a crosslinking agent and the like.

Although the procedure for forming the underlayer film 102 is not particularly limited, for example, a procedure in which the composition for underlayer film formation is applied on the substrate 101 according to a well-known method such as a spin coating method, and thereafter the film formation is allowed through hardening by exposure and/or heating, and the like may be exemplified. Examples of the radioactive ray which may be employed for the exposure include visible light rays, ultraviolet rays, far ultraviolet rays, X-rays, electron beams, γ-rays, molecular beams, ion beams, and the like. The lower limit of the heating temperature is not particularly limited, and is preferably 90° C. On the other hand, the upper limit of the heating temperature is not particularly limited, and is preferably 550° C., more preferably 450° C., and still more preferably 300° C. The lower limit of the heating time period is preferably 5 sec, more preferably 10 sec, and still more preferably 20 sec. On the other hand, the upper limit of the heating time period is preferably 1,200 sec, more preferably 600 sec, and still more preferably 300 sec. The lower limit of the average thickness of the underlayer film 102 is not particularly limited, and is preferably 1 nm, more preferably 2 nm, and still more preferably 3 nm. On the other hand, the upper limit of the average thickness of the underlayer film 102 is not particularly limited, and is preferably 20,000 nm, more preferably 1,000 nm, still more preferably 100 nm, and particularly preferably 10 nm.

Prepattern-Forming Step

According to this step, a prepattern is formed. This prepattern may be formed on the substrate, or may be formed on the upper face side of the underlayer film 102 (i.e., the side of the underlayer film 102 not facing the substrate) as shown in FIG. 2. By forming the prepattern 103, the configuration of the phase separation structure by directed self-assembly in the coating film 104 (see FIG. 3) is controlled as described later, whereby a finer pattern can be formed. In addition, according to the material, size, shape, etc. of the prepattern 103, the phase separation structure in the resultant directed self-assembling film can be more minutely controlled by the composition for pattern formation. It is to be noted that the prepattern 103 may be appropriately selected depending on the desired pattern shape, and for example, a line-and-space pattern, a hole pattern, a cylinder pattern and the like may be employed. In a case where the pattern-forming method includes the prepattern-forming step, a directed self-assembling film 105 described later is formed typically in the region where the prepattern 103 is not provided.

As the procedure for forming the prepattern 103, those similar to well-known resist pattern-forming methods, and the like may be exemplified. In addition, a conventional composition for resist film formation such as a composition containing: a polymer having an acid-labile group; a radiation-sensitive acid generating agent; and an organic solvent may be used as the composition for forming the prepattern 103. Specifically, for example, a commercially available chemical amplification-type resist composition is coated on the substrate 101 or the underlayer film 102 to form a resist film. Next, an exposure is carried out by irradiating a desired region of the resist film with a radioactive ray through a mask having a specific pattern. Examples of the radioactive ray include electromagnetic radiation such as ultraviolet rays, far ultraviolet rays and X-rays; charged particle rays such as electron beams and α-rays; and the like. Of these, far ultraviolet rays are preferred, ArF excimer lasers and KrF excimer lasers are more preferred, and ArF excimer laser beams are even more preferred. Also, the exposure may employ a liquid immersion medium. Subsequently, post exposure baking (PEB) is carried out, followed by carrying out a development using an alkaline developer solution, a developer solution containing an organic solvent as a principal component, or the like, whereby a desired prepattern 103 can be formed. It is preferred that the prepattern 103 thus obtained is irradiated with, for example, an ultraviolet ray having a wavelength of 254 nm or the like, and is subjected to a heat treatment, thereby further facilitating hardening. The lower limit of the temperature in the heat treatment is, for example, 100° C. On the other hand, the upper limit of the temperature in the heat treatment is, for example, 200° C. The lower limit of the time period of the heat treatment is, for example, 1 min. On the other hand, the upper limit of the time period of the heat treatment is, for example, 30 min.

It is to be noted that the surface of the prepattern 103 may be subjected to a hydrophobilization treatment or a hydrophilization treatment. In specific treatment procedures, a hydrogenation treatment including exposing to hydrogen plasma for a certain time period, and the like may be adopted. An increase of the hydrophobicity or hydrophilicity of the surface of the prepattern 103 enables the directed self-assembly in the coating film 104 to be accelerated.

Directed Self-Assembling Film-Forming Step

Figure 4:
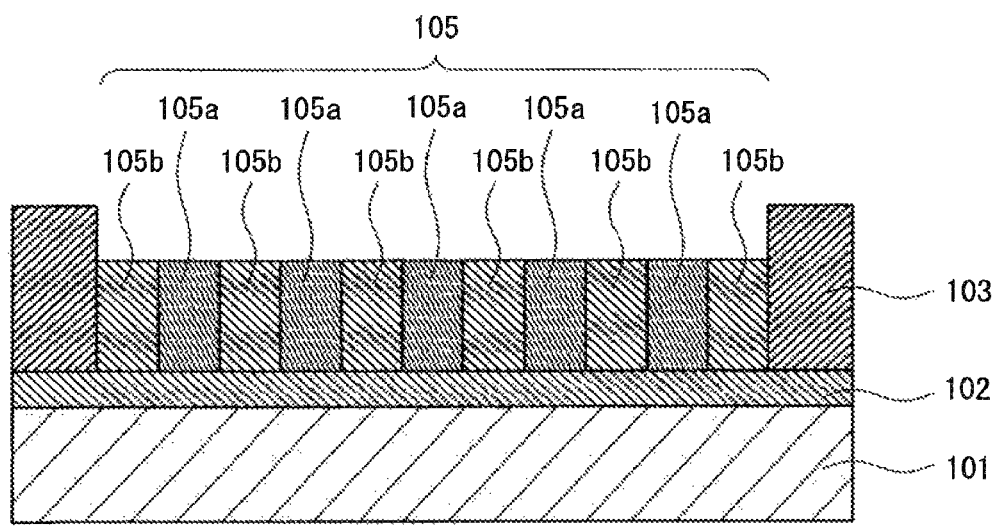
FIG. 4 shows a schematic cross sectional view illustrating one example of a state after converting the coating film shown in FIG. 3 into a directed self-assembling film.

According to this step, a directed self-assembling film having a phase separation structure is formed on the substrate using the composition for pattern formation. In a case where the underlayer film and the prepattern are not used, the composition for pattern formation is directly coated on the substrate to give a coating film, whereby the directed self-assembling film having a phase separation structure is formed. Alternatively, in a case where the underlayer film and the prepattern are used, as shown in FIGS. 3 and 4, the composition for pattern formation is coated on a region surrounded by the prepattern 103 on the underlayer film 102 to give the coating film 104, and a directed self-assembling film 105 having a phase separation structure is formed on the underlayer film 102 formed on the substrate 101. The directed self-assembling film formed is exemplified by those having a phase separation structure that includes interfaces substantially perpendicular to the substrate 101 like the directed self-assembling film 105 shown in FIG. 4, for example, and the like. In this step, the use of the composition for pattern formation enables the directed self-assembling film 105 accompanied by fewer defects of the regular array structure to be obtained with coating defects being precluded due to due to a superior coating property.

In a case where the prepattern is formed on the substrate 101, the phase separation structure is preferably formed along the prepattern, and the boundaries formed by the phase separation are more preferably substantially parallel to a lateral face of the prepattern. For example, in a case where a lamellar phase separation structure shown in FIG. 4 is formed, among the blocks included in the block copolymer (A), blocks having a higher affinity to the lateral face of the prepattern 103 (referred to as "block (β)") form block (β) phases 105b along the prepattern 103, whereas blocks having a lower affinity to the lateral face (referred to as "block (α)") form block (α) phases 105a at positions away from the prepattern 103. It is to be noted that although the phase separation structure formed in this step is configured with a plurality of phases, the boundaries per se may not necessarily be clear.

Although the procedure for providing the coating film 104 by coating the composition for pattern formation on one face side of substrate 101 is not particularly limited, for example, a procedure in which the composition for pattern formation employed is coated by spin coating etc., and the like may be involved. Accordingly, a space between facing walls of the prepattern 103 on the underlayer film 102 is filled with the composition for pattern formation. The lower limit of the average thickness of the coating film 104 formed is, for example, 10 nm. On the other hand, the upper limit of the average thickness of the coating film 104 formed is, for example, 60 nm.

The procedure for producing the directed self-assembling film 105 by causing phase separation in the coating film 104 is exemplified by annealing, and the like. The annealing process may include, for example, heating by using an oven, a hot plate or the like. The lower limit of the annealing temperature is typically 80° C., preferably 120° C., more preferably 160° C., and still more preferably 200° C. On the other hand, the upper limit of the annealing temperature is typically 400° C., preferably 350° C., more preferably 300° C., and particularly preferably 260° C. The lower limit of the annealing time period is preferably 10 sec, more preferably 20 sec, still more preferably 40 sec, and particularly preferably 90 sec. On the other hand, the upper limit of the annealing time period is preferably 120 min, more preferably 30 min, still more preferably 10 min, and particularly preferably 3 min. The lower limit of the average thickness of the resulting directed self-assembling film 105 is preferably 0.1 nm, more preferably 1 nm, and still more preferably 5 nm. On the other hand, the upper limit of the average thickness of the directed self-assembling film 105 is preferably 500 nm, more preferably 100 nm, and still more preferably 50 nm.

Removing Step

According to this step, block ($\alpha$) phases 105a, a part of phases in the phase separation structure, included in the directed self-assembling film 105 are removed as shown in FIGS. 4 and 5. By way of the difference in the etching rate of each of phases yielded by the phase separation through directed self-assembly, the block ($\alpha$) phase 105a can be removed by an etching treatment. It is to be noted that before the etching treatment, irradiation with a radioactive ray may be carried out as needed. As the radioactive ray, for example, when the phases to be removed by the etching are poly (meth)acrylic acid ester block phases, a radioactive ray having a wavelength of 254 nm may be used. Since the irradiation with the radioactive ray leads to decomposition of the poly (meth)acrylic acid ester block phases, etching is further facilitated.

As the procedure for removing the block ($\alpha$) phases, well-known procedures e.g., reactive ion etching (RIE) such as chemical dry etching and chemical wet etching; physical etching such as sputter etching and ion beam etching; and the like may be exemplified. Of these, reactive ion etching (RIE) is preferred, and in particular, chemical dry etching carried out by using a $CF_4$ gas, an $O_2$ gas or the like, and chemical wet etching (wet development) carried out by using an etching liquid, i.e., an organic solvent, or a liquid such as hydrofluoric acid are more preferred. Examples of the organic solvent include: alkanes such as n-pentane, n-hexane and n-heptane; cycloalkanes such as cyclohexane, cycloheptane and cyclooctane; saturated carboxylic acid esters such as ethyl acetate, n-butyl acetate, i-butyl acetate and methyl propionate; ketones such as acetone, methyl ethyl ketone, methyl isobutyl ketone and methyl n-pentyl ketone; alcohols such as methanol, ethanol, 1-propanol, 2-propanol and 4-methyl-2-pentanol; and the like. These solvents may be used either alone of one type, or two or more types thereof may be used in combination. It is to be noted that in this step, the block phases ($\beta$) may be removed.

Prepattern-Removing Step

In a case where the prepattern 103 is formed on the substrate, it is preferred that the prepattern 103 is removed in this step as shown in FIG. 5. Removal of the prepattern 103 enables design freedom of the formed pattern (pattern constituted with 105b shown in FIG. 5) to be improved. It is to be noted that with respect to the procedure for removing the prepattern 103, the description in connection with the procedure for removing the block ($\alpha$) phases may be adopted. Also, this step may be carried out concomitantly with the removing step, or may be carried out before or after the removing step.

Substrate Pattern-Forming Step

It is preferred that the pattern-forming method further includes a substrate pattern-forming step after the removing step. In this step, the underlayer film 102 and the substrate 101 are etched to permit patterning by using a part of the residual directed self-assembling film (pattern constituted with 105b shown in FIG. 5) as a mask. After completion of the patterning onto the substrate 101, the block ($\beta$) phases 105b used as a mask are removed from the substrate by a dissolving treatment or the like, whereby a patterned substrate (pattern) can be finally obtained. The resulting pattern is exemplified by a line-and-space pattern, a hole pattern and the like. As the procedure for the etching, a procedure similar to that in the removing step may be employed, and the etching gas and the etching liquid may be appropriately selected in accordance with the material of the substrate, etc. For example, in a case where the substrate is a silicon material, a gas mixture of chlorofluorocarbon-containing gas and $SF_4$, or the like may be used. Alternatively, in a case where the substrate is a metal film, a gas mixture of $BCl_3$ and $Cl_2$, or the like may be used. The pattern obtained according to the pattern-forming method is suitably used for semiconductor elements and the like, and further the semiconductor elements are widely used for LED, solar cells, and the like.

It is to be noted that the resulting phase separation structure may be strictly controlled by altering the ratio of lengths of each block in the block copolymer (A) molecule, the length of the block copolymer (A) molecule (weight average molecular weight, etc.), the underlayer film, the prepattern, and the like. Therefore, a directed self-assembling film having a phase separation structure of, not only the lamellar structure shown in FIG. 4, but also a sea-island structure, a cylinder structure, a co-continuous structure or the like may be formed, and as a result, a desired fine pattern can be obtained.

Block Copolymer

The block copolymer of the still another embodiment of the present invention has the first block composed of the first repeating unit that includes a silicon atom, the second block composed of the second repeating unit that does not include a silicon atom, and the first group that bonds to at least one end of the main chain and links to the first block, wherein the first group is a monovalent group that forms a compound having ClogP of no less than 2.4 provided that a methyl group is bonded to an atom on a side of the main chain. The block copolymer can be suitably used as a polymer component of the composition for pattern formation. Since the block copolymer is described in the above section of (A) Block Copolymer of the aforementioned composition for pattern formation, description thereof is omitted here.

EXAMPLES

Hereinafter, the present invention is explained in detail by way of Examples, but the present invention is not in any way limited to these Examples. Measuring methods of physical properties are shown below.

Mw and Mn

The Mw and the Mn of each polymer were determined by GPC under the following conditions.

GPC columns: "G2000 HXL"×2, "G3000 HXL"×1, and "G4000 HXL"×1, available from Tosoh Corporation eluent: tetrahydrofuran (Wako Pure Chemical Industries, Ltd.);

flow rate: 1.0 mL/min;
sample concentration: 1.0% by mass;
amount of sample injected: 100 μL;
column temperature: 40° C.
detector: differential refractometer; and
standard substance: mono-dispersed polystyrene.

$^1$H-NMR Analysis

The $^1$H-NMR analysis was carried out using a nuclear magnetic resonance apparatus ("JNM-EX400", available from JEOL, Ltd.). The proportion of each repeating unit contained in each polymer was calculated from the area ratio of the peak corresponding to each repeating unit on the spectrum obtained by $^1$H-NMR.

Comparative Example 1: Synthesis of Block Copolymer (A-12)

After a 500 mL flask as a reaction vessel was dried under reduced pressure, 168 g of tetrahydrofuran, which had been subjected to a dehydrating treatment by distillation, was charged into the flask under a nitrogen atmosphere, and cooled to −78° C. To this tetrahydrofuran were added 6.00 mL (2.98 mmol) of a 0.5 N lithium chloride solution in tetrahydrofuran and 0.63 mL (4.48 mmol) of diphenylethylene, and the mixture was sufficiently stirred. Thereafter, to the stirred solution was charged 1.53 mL (1.50 mmol) of a 1 N sec-butyllithium (sec-BuLi) solution in cyclohexane, and then a mixed solution containing 14.8 mL (134.4 mmol) of methyl methacrylate which had been subjected to a dehydrating treatment by distillation, and 10 g of tetrahydrofuran which had been subjected to a distillation treatment was added dropwise over 30 min. During this dropwise addition, the internal temperature of the reaction solution was carefully adjusted so as not to be −65° C. or higher. After the completion of the dropwise addition, the mixture was aged for 120 min, and then 10 g of tetrahydrofuran which had been subjected to a dehydrating treatment by distillation and 15.1 mL (33.1 mmol) of 3-tris[(trimethylsilyloxy)silyl]propyl methacrylate were added dropwise thereto over 30 min. After the completion of the dropwise addition, the mixture was aged for 120 min, and then 0.032 g (1.00 mmol) of methanol as a chain-end terminator (c-1) was added thereto, whereby the termination reaction of the polymerization end was allowed. Purification by precipitation in methanol of thus obtained polymer solution, followed by filtration gave a white solid.

The resultant white solid was dissolved in methyl isobutyl ketone to give a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove a Li salt. Then, 500 g of ultra pure water was charged to this solution, the mixture was stirred, and then the underlayer, i.e., an aqueous layer, was discarded. This operation was repeated three times to remove oxalic acid. Thereafter, the solution was concentrated, and then the concentrate was added dropwise to 2,000 g of methanol to permit deposition of a polymer. The polymer was subjected to vacuum filtration and further to washing twice with methanol, and then dried at 60° C. under reduced pressure to obtain a white block copolymer (A-12). This block copolymer (A-12) had the Mw of 18,022, the Mn of 17,585, and the Mw/Mn of 1.02. In addition, as a result of the $^1$H-NMR analysis, the block polymer (A-12) was revealed to have each proportion of the repeating unit derived from methyl methacrylate (MMA) and the repeating unit derived from 3-tris[(trimethylsilyloxy)silyl]propyl methacrylate (TMSP) contained being each 50.0% by mass (80.2 mol %) and 50.0% by mass (19.8 mol %). It is to be noted that the block copolymer (A-12) was a diblock copolymer.

Examples 1 to 11 and Comparative Examples 2 to 5: Synthesis of Block Copolymers (A-1) to (A-11) and (A-13) to (A-16)

As in the following, block copolymer block copolymers (A-1) to (A-11) and (A-13) to (A-16) were synthesized by a similar operation to the synthesis of the block copolymer (A-12) except that chain-end terminator (C-1) to (C-11) or (c-2) to (c-5) was used in place of the chain-end terminator (c-1).

Note that: the chain-end terminator (C-1) was 1-bromodecane; the chain-end terminator (C-2) was benzyl bromide; the chain-end terminator (C-3) was trityl bromide; the chain-end terminator (C-4) was 2-bromoadamantane; the chain-end terminator (C-5) was 9-bromomethylcarbazole; the chain-end terminator (C-6) was 4-bromobiphenyl; the chain-end terminator (C-7) was 2-bromonaphthalene; the chain-end terminator (C-8) was 2-bromofluorene; the chain-end terminator (C-9) was 9-bromo-9-phenylfluorene; the chain-end terminator (C-10) was 2-bromonorbornane; the chain-end terminator (C-11) was 2-bromothiophene; the chain-end terminator (c-1) was methanol; the chain-end terminator (c-2) was ethyl bromohexanoate; the chain-end terminator (c-3) was dimethylformamide; the chain-end terminator (c-4) was methylglycidyl ether; and the chain-end terminator (c-5) was α-bromo-γ-butyrolactone. Structures of these chain-end terminators (C-1) to (C-11) and (c-1) to (c-5) are shown by the following formulae.

(C-1)

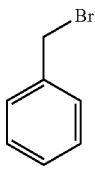

(C-2)

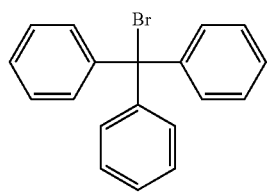

(C-3)

-continued (C-4) 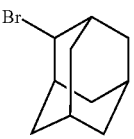

(C-5) 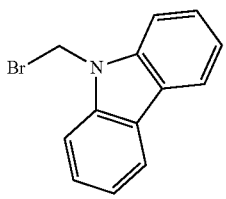

(C-6) 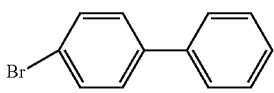

(C-7) 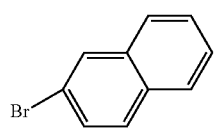

(C-8) 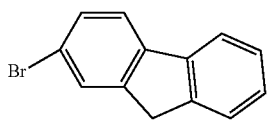

(C-9) 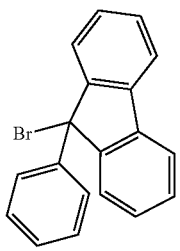

(C-10) 

(C-11) 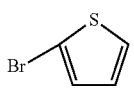

(c-1) CH₃OH (c-2) BrC₅H₁₀COOC₂H₅

(c-3) 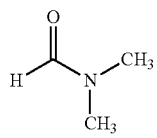

(c-4) 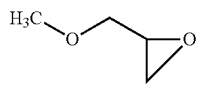

(C-5) 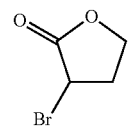

Reference Example 1: Synthesis of Block Copolymer (A-17)

After a 500 mL flask as a reaction vessel was dried under reduced pressure, 200 g of tetrahydrofuran, which had been subjected to a dehydrating treatment by distillation, was charged into the flask under a nitrogen atmosphere, and cooled to −78° C. Thereafter, to this tetrahydrofuran was charged 0.61 mL (0.60 mmol) of a 1 N sec-butyllithium (sec-BuLi) solution in cyclohexane, and then 22.1 mL (0.192 mol) of styrene which had been subjected to adsorption filtration by silica gel for removing a polymerization inhibitor, and to a dehydrating treatment by distillation was added dropwise over 30 min. The polymerization system was confirmed to have an orange color. During this dropwise addition, the internal temperature of the reaction solution was carefully adjusted so as not to be −60° C. or higher. After the completion of the dropwise addition, the mixture was aged for 30 min, and then 0.23 mL (0.0016 mol) of 1,1-diphenylethylene and 2.18 mL (0.0011 mol) of a 0.5 N lithium chloride solution in tetrahydrofuran was added and the polymerization system was confirmed to have a dark red color. Furthermore, 20.4 mL (0.192 mol) of methyl methacrylate which had been subjected to adsorption filtration by silica gel for removing a polymerization inhibitor, and to a dehydrating treatment by distillation was added dropwise to this solution over 30 min. The polymerization system was confirmed to have a pale yellow color, and thereafter the reaction was allowed for 120 min. Then 1 mL of methanol as the chain-end terminator (c-1) was charged to allow the termination reaction of the polymerization end. The temperature of this reaction solution was elevated to the room temperature, and thus obtained reaction solution was concentrated and replacement with methyl isobutyl ketone (MIBK) was carried out. Thereafter, 1,000 g of a 2% aqueous oxalic acid solution was added dropwise thereto with stirring, and after the mixture was left to stand, the underlayer, i.e., an aqueous layer, was discarded. This operation was repeated three times to remove metal Li. Then, 1,000 g of ultra pure water was charged with stirring, and then the underlayer, i.e., an aqueous layer, was discarded. This operation was repeated three times to remove oxalic acid. The solution was concentrated, and then the concentrate was added dropwise to 500 g of methanol to permit deposition of a polymer. The polymer was subjected to vacuum filtration and further to washing twice with methanol, and then dried at 60° C. under reduced pressure to obtain 38.5 g of a white block copolymer (A-17).

This block copolymer (A-17) had the Mw of 42,000, the Mn of 40,000, and the Mw/Mn of 1.05. In addition, as a result of the ¹H-NMR analysis, the block polymer (A-17) was revealed to have the proportion of the repeating unit derived from styrene (ST) and the repeating unit derived from methyl methacrylate (MMA) contained being each 50.0% by mass (50.3 mol %) and 50.0% by mass (49.7 mol %). It is to be noted that the block copolymer (A-17) was a diblock copolymer.

Structures of the block copolymers (A-1) to (A-17) synthesized in Examples 1 to 11, Comparative Examples 1 to 5 and Reference Example 1 are shown by the following formulae.
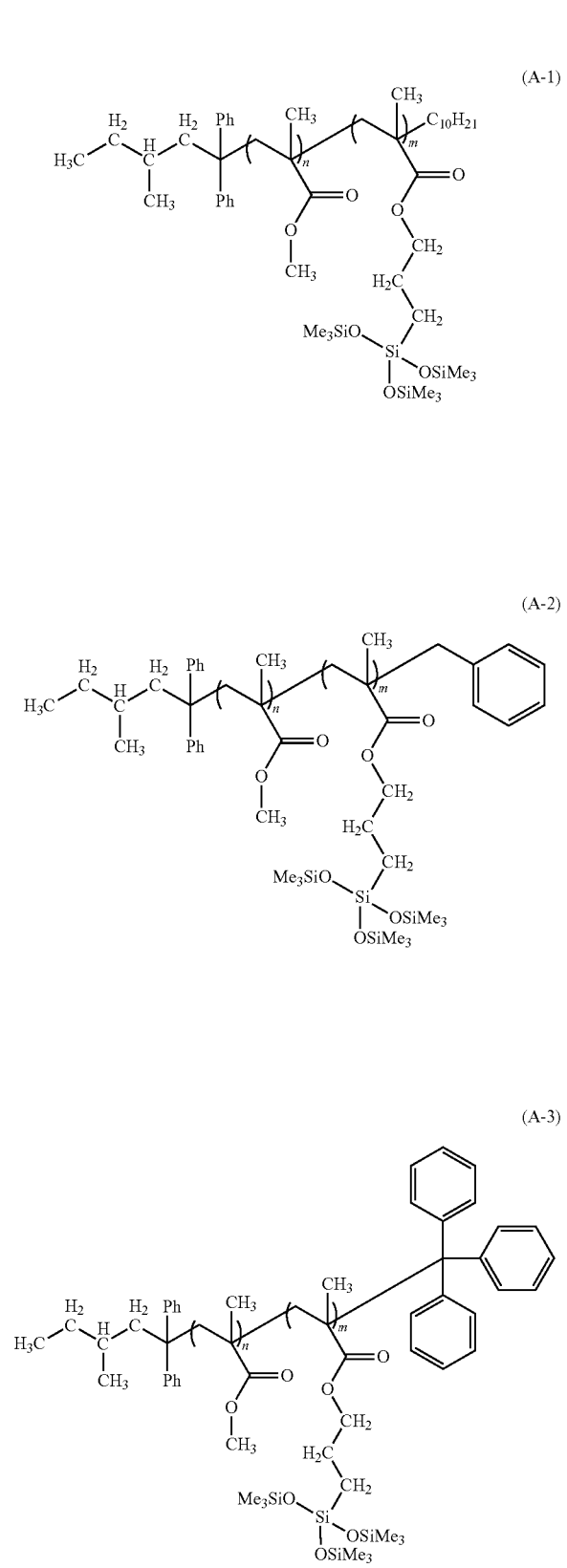
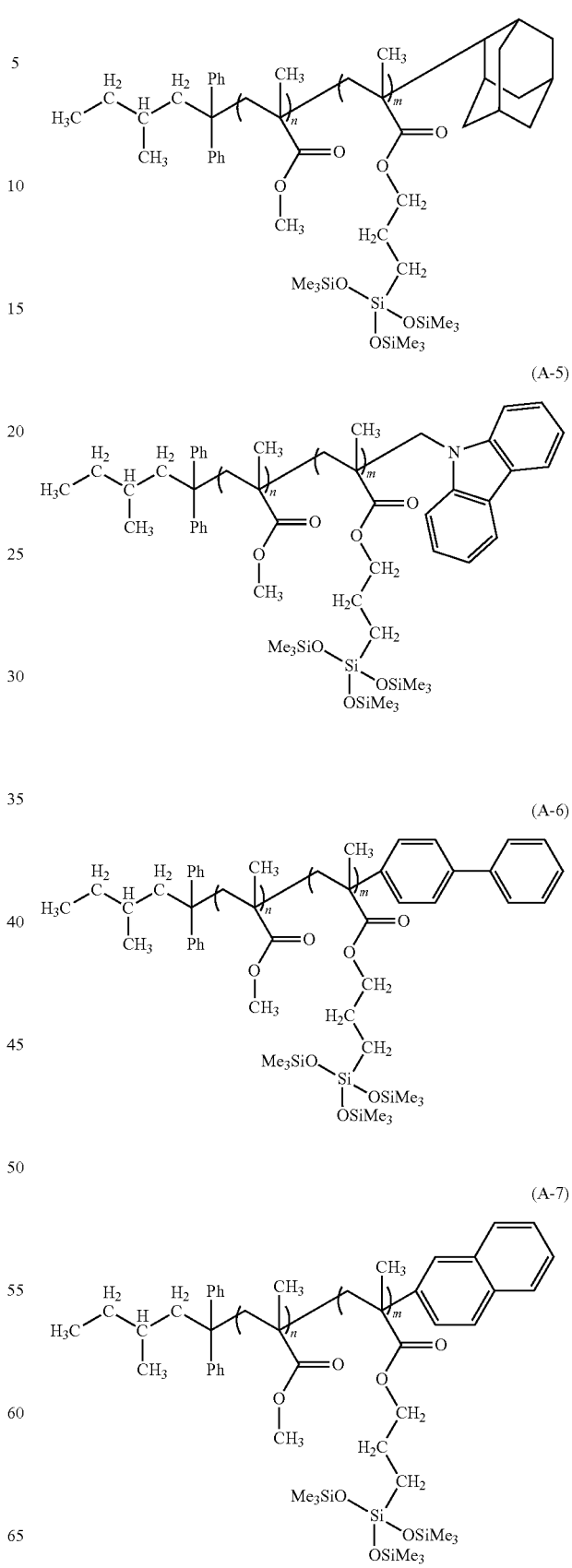

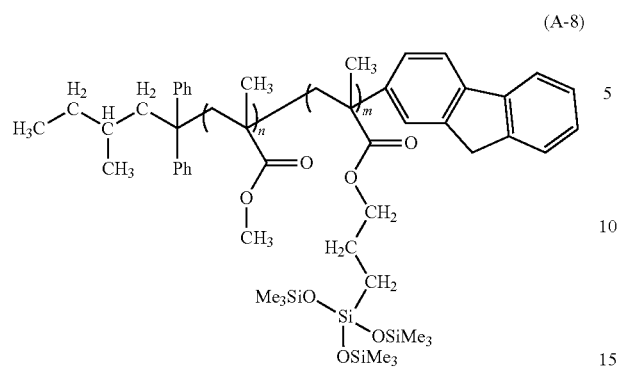
(A-8)
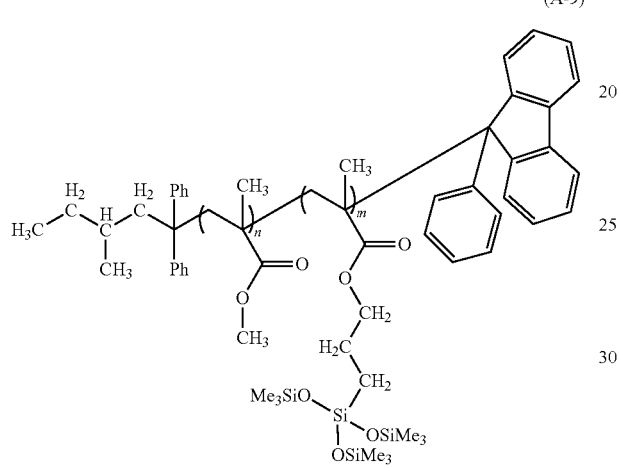
(A-9)
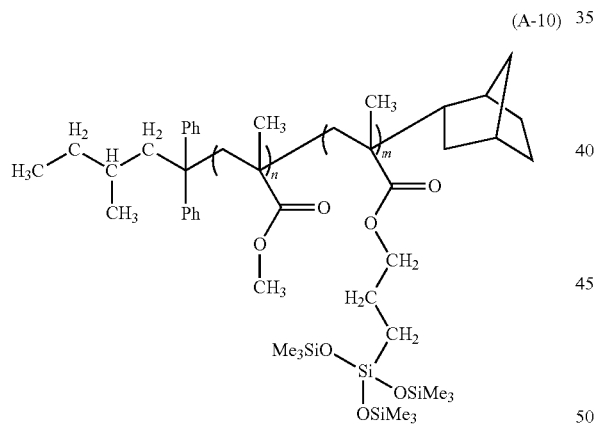
(A-10)
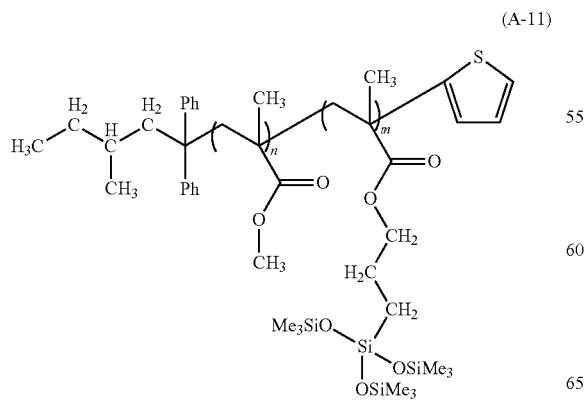
(A-11)
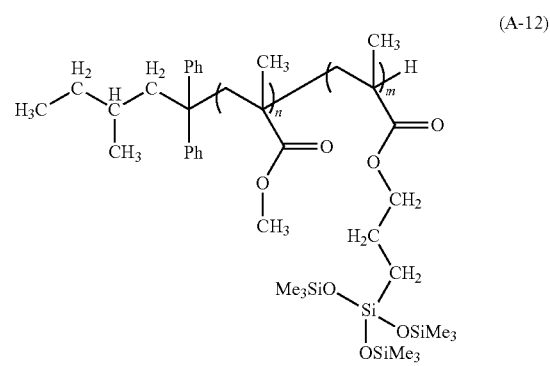
(A-12)
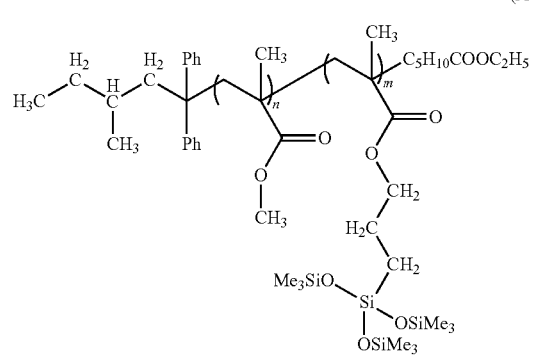
(A-13)
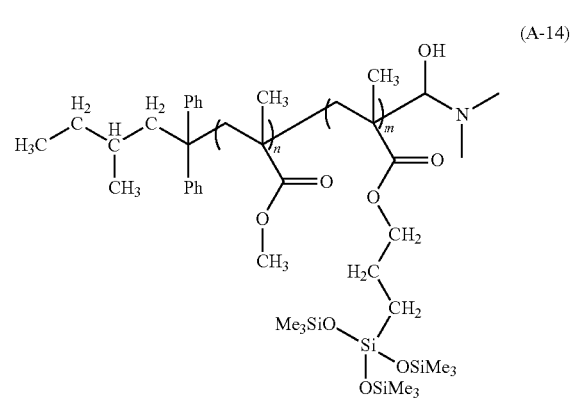
(A-14)
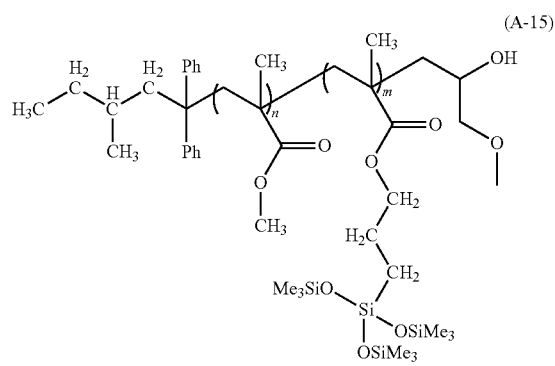
(A-15)

-continued

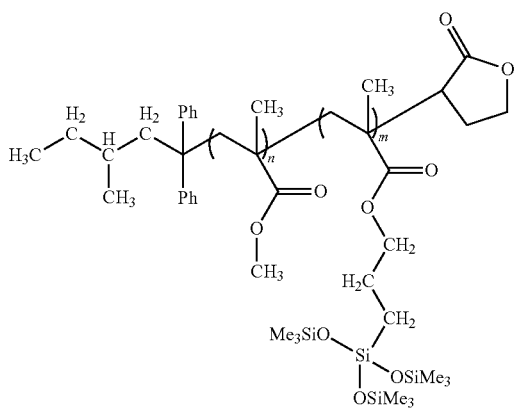
(A-16)

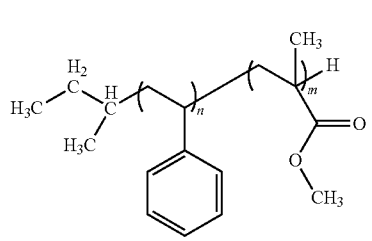
(A-17)

In the above formulae (A-1) to (A-17), n and m are each independently an integer of no less than 2.

Calculation of ClogP

ClogP of the chain-end terminator, and of a compound derived, provided that a methyl group had been bonded to the group (terminal group) linked to the block (a) of the block copolymer (A), was calculated by using "Chemdraw Ver. 12" available from CambridgeSoft Corporation. It is to be noted that ClogP of the compound derived by bonding a methyl group to the group (terminal group) linked to the block (a) of the block copolymer (A) may be referred to as "ClogP of the terminal group" in the following.

In Table 1 below, the proportion of each repeating unit of the block copolymers (A-1) to (A-17) contained, the chain-end terminators used in the synthesis, ClogP of the chain-end terminator, ClogP of the terminal group, the Mw, the Mn, and the Mw/Mn are presented. It is to be noted that in the following Table 1, "–" denotes that a block composed of the corresponding repeating unit is not included. Furthermore, since the chain-end terminator (c-1) is one that does not form a terminal group, ClogP is indicated as being "–" for abbreviation.

TABLE 1

| | (A) Block copolymer | Repeating unit (I) | | | Repeating unit (II) | | | Chain-end terminator | | ClogP of terminal group | Mw | Mn | Mw/Mn |
| --- | --- | --- | --- | --- | --- | --- | --- | --- | --- | --- | --- | --- | --- |
| | | monomer type | proportion of amount (mol %) | repeating unit (mass %) | monomer type | proportion of amount (mol %) | repeating unit (mass %) | type | ClogP | | | | |
| Example 1 | A-1 | TMSP | 19.8 | 46.5 | MMA | 80.2 | 53.5 | C-1 | 5.84 | 5.09 | 17,541 | 17,000 | 1.03 |
| Example 2 | A-2 | TMSP | 19.8 | 48.0 | MMA | 80.2 | 52.0 | C-2 | 2.92 | 2.94 | 16,885 | 16,362 | 1.03 |
| Example 3 | A-3 | TMSP | 19.8 | 49.0 | MMA | 80.2 | 51.0 | C-3 | 5.93 | 6.11 | 16,114 | 15,616 | 1.03 |
| Example 4 | A-4 | TMSP | 19.8 | 48.0 | MMA | 80.2 | 52.0 | C-4 | 4.72 | 3.55 | 16,850 | 16,328 | 1.03 |
| Example 5 | A-5 | TMSP | 19.8 | 48.5 | MMA | 80.2 | 51.5 | C-5 | 4.24 | 3.20 | 17,762 | 17,245 | 1.03 |
| Example 6 | A-6 | TMSP | 19.8 | 48.7 | MMA | 80.2 | 51.3 | C-6 | 4.89 | 4.20 | 17,776 | 17,259 | 1.03 |
| Example 7 | A-7 | TMSP | 19.8 | 48.0 | MMA | 80.2 | 52.0 | C-7 | 4.18 | 3.90 | 18,057 | 17,532 | 1.03 |
| Example 8 | A-8 | TMSP | 19.8 | 49.7 | MMA | 80.2 | 50.3 | C-8 | 4.45 | 4.60 | 17,811 | 17,293 | 1.03 |
| Example 9 | A-9 | TMSP | 19.8 | 49.5 | MMA | 80.2 | 50.5 | C-9 | 6.04 | 5.77 | 17,995 | 17,471 | 1.03 |
| Example 10 | A-10 | TMSP | 19.8 | 48.8 | MMA | 80.2 | 51.2 | C-10 | 3.60 | 2.58 | 18,120 | 17,593 | 1.03 |
| Example 11 | A-11 | TMSP | 19.8 | 49.1 | MMA | 80.2 | 50.9 | C-11 | 2.69 | 2.45 | 18,434 | 17,898 | 1.03 |
| Comparative Example 1 | A-12 | TMSP | 19.8 | 50.0 | MMA | 80.2 | 50.0 | c-1 | — | *1 | 18,022 | 17,585 | 1.02 |
| Comparative Example 2 | A-13 | TMSP | 19.8 | 49.4 | MMA | 80.2 | 50.6 | c-2 | 2.15 | 2.20 | 15,810 | 15,202 | 1.04 |
| Comparative Example 3 | A-14 | TMSP | 19.8 | 46.5 | MMA | 80.2 | 53.5 | c-3 | −0.81 | 0.25 | 17,713 | 17,183 | 1.03 |
| Comparative Example 4 | A-15 | TMSP | 19.8 | 50.7 | MMA | 80.2 | 49.3 | c-4 | −0.20 | 0.38 | 15,833 | 15,390 | 1.03 |
| Comparative Example 5 | A-16 | TMSP | 19.8 | 50.9 | MMA | 80.2 | 49.1 | c-5 | −0.43 | 2.32 | 16,371 | 15,853 | 1.03 |
| Reference Example 1 | A-17 | — | — | — | ST MMA | 50.0 50.0 | 50.0 50.0 | c-1 | — | *1 | 42,000 | 40,000 | 1.05 |

*1: not having a terminal group linked to the block (a)

Examples 12 to 22 and Comparative Examples 6 to 10 and Reference Example 2: Preparation of Compositions for Pattern Formation (S-1) to (S-17)

The block copolymer (A-1) was dissolved in propylene glycol monomethyl ether acetate (PGMEA) to give a 1.5% by mass solution. This solution was filtered through a membrane filter having a pore size of 40 nm to prepare a composition for pattern formation (S-1). As in the following, compositions for pattern formation (S-2) to (S-17) were prepared by a similar operation to the preparation of the composition for pattern formation (S-1) except that (A-2) to (A-17) were each used as the block copolymer.

Synthesis Example 1: Preparation of Composition for Underlayer Film Formation

To a flask equipped with a condenser and a stirrer was charged 100 g of methyl ethyl ketone, and nitrogen substitution was carried out. This flask was heated to 85° C., and a mixed solution of 100 g of methyl ethyl ketone, 51.0 g (0.49 mol) of styrene, 49.0 g (0.49 mol) of methyl methacrylate, 3.00 g (0.027 mol) of 3-mercapto-1,2-propanediol and 1.00 g (0.0061 mol) of 2,2'-azobis(2-methylpropionitrile) was added dropwise over 3 hrs while the temperature after the heating was maintained. Polymerization was allowed for 3 hrs while the temperature was further maintained. Thus obtained polymer solution was subjected to purification by precipitation in 3 L of methanol to remove residual monomer, polymerization initiator and the like. This polymer had the Mw of 8,285, the Mn of 5,355, and the Mw/Mn of 1.54. Next, the polymer was diluted with propylene glycol monomethyl ether acetate to give a 10% by mass polymer solution (N-1).

A mixed solution was obtained by mixing and dissolving 150 g of the polymer solution (N-1), and 9,850 g of propylene glycol monomethyl ether acetate as the solvent. The mixed solution thus obtained was filtered through a membrane filter having a pore size of 0.1 μm to prepare a composition for underlayer film formation.

Evaluations

Directed self-assembling films having a regular array structure (finger print pattern) were produced on a substrate, with the compositions for pattern formation (S-1) to (S-17) according to the method shown below, and pitch and edge roughness of the finger print pattern was evaluated.

Formation of Directed Self-Assembling Film

The composition for underlayer film formation was applied on the surface of a 12-inch silicon wafer as a substrate such that the coating film to be formed had an average thickness of 5 nm, and thereafter baked at 220° C. for 120 sec to obtain a substrate having the underlayer film formed thereon.

The compositions for pattern formation (S-1) to (S-17) were each applied on the substrate on which the underlayer film had been formed such that the coating film to be formed had an average thickness of 35 nm, and thereafter baked at 230° C. for 120 sec. By thus baking, the directed self-assembling films having the finger print pattern were formed on the substrate on which the underlayer film had been formed. Each image of the finger print patterns spread on the substrate was taken by using SEM ("CG4000" available from Hitachi High-Technologies Corporation) at 300,000-fold magnification.

Evaluation of Pitch of Finger Print Pattern

The pitch of the finger print pattern was evaluated on the image of 300,000-fold magnification by a periodic analysis using an IMEC calculation tool built into the SEM. Smaller value of the pitch (nm) of the finger print pattern indicates a favorable result due to being a fine pitch in the phase separation structure formed. The pitch (nm) of the finger print pattern was evaluated to be: "favorable" in the case of being no greater than 22 nm; and "unfavorable" in the case of being greater than 22 nm.

Evaluation of Finger Print Pattern Edge Roughness (FER)

The finger print pattern edge roughness (FER) was evaluated on the image of 300,000-fold magnification by an analysis using a FER calculation tool built into the SEM. Smaller value of FER (nm) indicates a favorable result due to less edge roughness of the finger print pattern formed, i.e., less generation of defects of the regular array structure in the directed self-assembling film. The FER (nm) of the finger print pattern was evaluated to be: "favorable" in the case of being no greater than 3.15 nm; and "unfavorable" in the case of being greater than 3.15 nm.

In Table 2 below, the results of the evaluations of the compositions for pattern formation (S-1) to (S-17) are presented. The ClogP of the terminal group of the block copolymer (A) contained in each of the compositions for pattern formation (S-1) to (S-17) is shown together in the following Table 2.

TABLE 2

| | Composition for pattern formation | (A) Block copolymer | ClogP of terminal group | Pitch pattern (nm) | FER (nm) |
|---|---|---|---|---|---|
| Example 12 | S-1 | A-1 | 5.09 | 19.3 | 2.80 |
| Example 13 | S-2 | A-2 | 2.94 | 18.1 | 2.85 |
| Example 14 | S-3 | A-3 | 6.11 | 17.3 | 2.67 |
| Example 15 | S-4 | A-4 | 3.55 | 18.7 | 2.95 |
| Example 16 | S-5 | A-5 | 3.20 | 17.8 | 2.93 |
| Example 17 | S-6 | A-6 | 4.20 | 17.7 | 2.90 |
| Example 18 | S-7 | A-7 | 3.90 | 17.5 | 2.92 |
| Example 19 | S-8 | A-8 | 4.60 | 18.1 | 2.86 |
| Example 20 | S-9 | A-9 | 5.77 | 17.7 | 2.65 |
| Example 21 | S-10 | A-10 | 2.58 | 17.9 | 3.03 |
| Example 22 | S-11 | A-11 | 2.45 | 18.1 | 3.10 |
| Comparative Example 6 | S-12 | A-12 | *1 | 19.9 | 3.19 |
| Comparative Example 7 | S-13 | A-13 | 2.20 | 17.4 | 3.22 |
| Comparative Example 8 | S-14 | A-14 | 0.25 | 17.0 | 3.34 |
| Comparative Example 9 | S-15 | A-15 | 0.38 | 19.0 | 3.24 |
| Comparative Example 10 | S-16 | A-16 | 2.32 | 17.4 | 3.20 |
| Reference Example 2 | S-17 | A-17 | *1 | 24.2 | 4.35 |

*1: not having a terminal group linked to the block (a)

As shown in Table 2, it was revealed that the compositions for pattern formation of Examples 12 to 22 and Comparative Examples 6 to 10 were capable of forming a directed self-assembling film having a regular array structure with fine pitches, as compared with the composition for pattern formation of Reference Example 2. In addition, the compositions for pattern formation of Examples 12 to 22 were revealed to be capable of forming a directed self-assembling film having a regular array structure accompanied by fewer defects as compared with the compositions for pattern formation of Comparative Examples 6 to 10. In other words, it is considered that the compositions for pattern formation of Examples 12 to 22 can be used for formation of patterns having a fine and favorable shape.

INDUSTRIAL APPLICABILITY

According to the composition for pattern formation, the pattern-forming method and the block copolymer of the

What is claimed is:

1. A composition for pattern formation comprising:
a block copolymer that forms a phase separation structure by directed self-assembly; and
a solvent,
wherein the block copolymer comprises a first block composed of a first repeating unit that comprises a silicon atom, a second block composed of a second repeating unit that does not include a silicon atom, and a first group that bonds to at least one end of a main chain and links to the first block,
wherein the first group is a monovalent group that forms a compound having ClogP of no less than 2.4 provided that a methyl group is bonded to an atom on a side of the main chain, and
wherein the first group does not comprise a hetero atom.

2. The composition for pattern formation according to claim 1, wherein the first group is a monovalent hydrocarbon group having 3 to 25 carbon atoms.

3. The composition for pattern formation according to claim 1, wherein the first group is an alkyl group, a cycloalkyl group, an aryl group, or an aralkyl group.

4. The composition for pattern formation according to claim 1, wherein the first repeating unit is represented by the following formula (1):

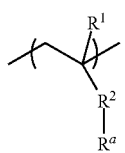

(1)

wherein, in the formula (1),
R$^1$ represents a hydrogen atom, a fluorine atom, a methyl group or a trifluoromethyl group;
R$^2$ represents a single bond, —O—, —COO— or —CONH—; and
R$^a$ represents a monovalent group having 1 to 20 silicon atoms.

5. The composition for pattern formation according to claim 1, wherein the second repeating unit is a (meth)acrylic acid ester unit, or a substituted or unsubstituted styrene unit.

6. The composition for pattern formation according to claim 1, wherein the block copolymer is a diblock copolymer or a triblock copolymer.

7. The composition for pattern formation according to claim 1, wherein the number of carbon atoms of the first group is at least 6.

8. A pattern-forming method comprising:
forming on one face side of a substrate, a directed self-assembling film in which phase separation is caused; and
removing a part of the directed self-assembling film,
wherein the directed self-assembling film is formed from a composition,
wherein the composition comprises:
a block copolymer that forms a phase separation structure by directed self-assembly; and
a solvent,
wherein the block copolymer comprises a first block composed of a first repeating unit that comprises a silicon atom, a second block composed of a second repeating unit that does not include a silicon atom, and a first group that bonds to at least one end of a main chain and links to the first block,
wherein the first group is a monovalent group that forms a compound having ClogP of no less than 2.4 provided that a methyl group is bonded to an atom on a side of the main chain, and
wherein the first group does not comprise a hetero atom.

9. The pattern-forming method according to claim 8, further comprising before the forming the directed self-assembling film, forming an underlayer film on one face side of the substrate,
wherein in the forming the directed self-assembling film, the directed self-assembling film is formed on a side of the underlayer film not facing the substrate.

10. The pattern-forming method according to claim 8, further comprising before the forming the directed self-assembling film,
forming a prepattern on one face side of the substrate,
wherein in the forming the directed self-assembling film, the directed self-assembling film is formed in a region where the prepattern is not provided.

11. The pattern-forming method according to claim 8, wherein a line-and-space pattern or a hole pattern is formed.

12. The pattern-forming method according to claim 8, wherein the first group is a monovalent chain hydrocarbon group having 3 to 25 carbon atoms, a monovalent alicyclic hydrocarbon group having 3 to 25 carbon atoms, or a monovalent aromatic hydrocarbon group having 6 to 25 carbon atoms.

13. The pattern-forming method according to claim 8, wherein the first group is a monovalent hydrocarbon group having 3 to 25 carbon atoms.

14. The pattern-forming method according to claim 8, wherein the first group is an alkyl group, a cycloalkyl group, an aryl group, or an aralkyl group.

15. The pattern-forming method according to claim 8, wherein the first repeating unit is represented by the following formula (1):

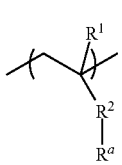

(1)

wherein, in the formula (1),

R¹ represents a hydrogen atom, a fluorine atom, a methyl group or a trifluoromethyl group;

R² represents a single bond, —O—, —COO— or —CONH—; and $R^a$ represents a monovalent group having 1 to 20 silicon atoms.

16. The pattern-forming method according to claim 8, wherein the second repeating unit is a (meth)acrylic acid ester unit, or a substituted or unsubstituted styrene unit.

17. The pattern-forming method according to claim 8, wherein the block copolymer is a diblock copolymer or a triblock copolymer.

18. The pattern-forming method according to claim 8, wherein the first group is a monovalent group that forms a compound having ClogP of no less than 5.5 provided that a methyl group is bonded to an atom on the side of the main chain.

19. The pattern-forming method according to claim 8, wherein the first group is a monovalent group that forms a compound having ClogP of no greater than 7 provided that a methyl group is bonded to an atom on the side of the main chain.

20. A block copolymer that forms a phase separation structure by directed self-assembly, comprising:
   a first block composed of a first repeating unit that includes a silicon atom; a second block composed of a second repeating unit that does not include a silicon atom; and a first group that bonds to at least one end of a main chain and links to the first block,
   wherein the first group is a monovalent group that forms a compound having ClogP of no less than 2.4 provided that a methyl group is bonded to an atom on a side of the main chain, and
   wherein the first group does not comprise a hetero group.

* * * * *